(12) United States Patent
Taira et al.

(10) Patent No.: US 10,896,984 B2
(45) Date of Patent: Jan. 19, 2021

(54) SOLAR CELL MODULE

(71) Applicant: Panasonic Intellectual Property Management Co., Ltd., Osaka (JP)

(72) Inventors: Shigeharu Taira, Osaka (JP); Yukihiro Yoshimine, Osaka (JP); Hiroyuki Kannou, Osaka (JP); Tomonori Tabe, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/269,512

(22) Filed: Feb. 6, 2019

(65) Prior Publication Data

US 2019/0172959 A1 Jun. 6, 2019

Related U.S. Application Data

(63) Continuation of application No. 15/428,032, filed on Feb. 8, 2017, now Pat. No. 10,224,439, which is a (Continued)

(30) Foreign Application Priority Data

Jul. 30, 2009 (JP) .................................. 2009-178320
May 31, 2010 (JP) .................................. 2010-124428

(51) Int. Cl.
*H01L 31/0224* (2006.01)
*H01L 31/02* (2006.01)
*H01L 31/05* (2014.01)

(52) U.S. Cl.
CPC .. *H01L 31/022433* (2013.01); *H01L 31/0201* (2013.01); *H01L 31/02013* (2013.01);
(Continued)

(58) Field of Classification Search
CPC ......... H01L 31/0201; H01L 31/022441; H01L 31/022425; H01L 31/022433; H01L 31/05;
(Continued)

(56) References Cited

U.S. PATENT DOCUMENTS 5,279,682 A * 1/1994 Wald ............... H01L 31/022425
136/256
10,224,439 B2 * 3/2019 Taira ............... H01L 31/022433
(Continued)

FOREIGN PATENT DOCUMENTS

JP 2008235354 A * 10/2008

OTHER PUBLICATIONS

English machine translation of JP 2008-235354A. (Year: 2008).*

*Primary Examiner* — Lindsay A Bernier
(74) *Attorney, Agent, or Firm* — Metrolex IP Law Group, PLLC

(57) ABSTRACT

In the solar cell module including a plurality of solar cells interconnected with wiring members, each of the solar cells includes a plurality of front-side finger electrodes that are disposed on a light-receiving surface of the solar cell and connected with tabs and a plurality of rear-side finger electrodes that are disposed on a rear surface of the solar cell and connected with tabs. Rear-side auxiliary electrode sections are arranged in regions, which is wider than the front-side finger electrodes, on the rear surface opposite to regions where the front-side finger electrodes are present.

12 Claims, 30 Drawing Sheets

Related U.S. Application Data continuation of application No. 13/361,007, filed on Jan. 30, 2012, now Pat. No. 9,608,138, which is a continuation-in-part of application No. PCT/JP2010/062929, filed on Jul. 30, 2010.

(52) U.S. Cl.
CPC ...... *H01L 31/022425* (2013.01); *H01L 31/05* (2013.01); *H01L 31/0504* (2013.01); *H01L 31/022441* (2013.01); *H01L 31/0516* (2013.01); *Y02E 10/50* (2013.01)

(58) Field of Classification Search
CPC ............ H01L 31/0504; H01L 31/0508; H01L 31/0516; H01L 31/02013; Y02E 10/50
See application file for complete search history.

(56) References Cited

U.S. PATENT DOCUMENTS

| | | | | |
|---|---|---|---|---|
| 2007/0186968 A1* | 8/2007 | Nakauchi | ........ | H01L 31/022425 136/244 |
| 2008/0149161 A1* | 6/2008 | Nishida | ........... | H01L 31/022433 136/244 |
| 2009/0266402 A1* | 10/2009 | Taira | ............... | H01L 31/022433 136/244 |

\* cited by examiner

SOLAR CELL MODULE

RELATED APPLICATION

This application is a continuing application of application Ser. No. 15/428,032, filed on Feb. 8, 2017, which is a continuing application of application Ser. No. 13/361,007, filed on Jan. 30, 2012, which is a continuing application of International application No. PCT/JP2010/062929, filed on Jul. 30, 2010, entitled "SOLAR CELL MODULE", which claims priority based on the Article 8 of Patent Cooperation Treaty from prior Japanese Patent Application Nos. JP 2009-178320, filed on Jul. 30, 2009, and JP 2010-124428, filed on May 31, 2010, the entire contents of all of which are incorporated herein by reference.

TECHNICAL FIELD

This invention relates to solar cell modules, and relates to a solar cell module including a plurality of solar cells interconnected by connecting electrodes formed on surfaces of the solar cells with wiring members.

BACKGROUND ART

A solar cell module is made up with a plurality of solar cells electrically connected in series and/or in parallel with each other with wiring members that are electrically connected to electrodes on surfaces of the solar cells. In solar cell module assembly, connection between the electrodes on the solar cells and wiring members are conventionally made with solder. Solder is widely used because it has excellent electric conductivity and reliable connectivity, i.e., high adherability, and it is an inexpensive material suited for many general-purpose applications.

On the other hand, some wire connecting methods without use of solder are being developed to reduce the influence of heat during the wiring member connection. For example, well-known method uses a resin adhesive to connect the solar cells and wiring members (see, e.g., PTL 1).

Wire connection with a resin adhesive begins with applying the resin adhesive between electrodes of a solar cell and wiring members and then heating the solar cell and wiring members while relatively applying pressure, thereby connecting the wiring members to the electrodes of the solar cell.

By the way, for the purpose of cost reduction and resource savings associated with solar cells, thinner solar cells are now in increasing demand.

The aforementioned wire connection method with the resin adhesive utilizes relative pressurization to connect the wiring members to the solar cell. The pressure applied for connection is partially transferred to the solar cell through the electrodes, and sometimes, the pressure creates shear stresses on a substrate of the solar cell, the stress being derived from the positional relationship between the electrodes formed on a light-receiving surface and the electrodes formed on a rear surface of the solar cell. The shear stresses cause cracks in the substrate, which lead to yield reduction. It is therefore especially important to deal with the shear stresses in the thinner solar cells.

To solve the above-described problem, the applicant of the present invention has proposed a solar cell module including a plurality of first finger electrodes that are disposed on a light-receiving surface and connected to wiring members and a plurality of second finger electrodes that are disposed on a rear surface and connected to wiring members, wherein the first finger electrodes and second finger electrodes are arranged so as to overlap one another on a projection plane in parallel with the light-receiving surface (see PTL 2).

CITATION LIST

Patent Literature

PTL 1: Japanese Unexamined Patent Application Publication No. 2007-214533
PTL 2: Japanese Unexamined Patent Application Publication No. 2008-235354

SUMMARY OF INVENTION

Technical Problem

In PTL 2, an ideal arrangement, as shown in FIG. 38, is to align an electrode finger 110 disposed on a light-receiving surface of a solar cell 1 with an electrode finger 120 disposed on a rear surface of the solar cell 1. After the finger electrodes 110 and 120 on the front and rear surfaces are aligned with each other, a resin adhesive is applied between wiring members 20 and the finger electrodes, and the wiring members 20 are pressed against the solar cell 1 as indicated by arrows in FIG. 38. Perfect alignment of the electrode finger 110 on the light-receiving surface with the electrode finger 120 on the rear surface reduces the shear force to be applied on the solar cell, thereby preventing the solar cell 1 from cracking. Note that the resin adhesive is not shown in FIG. 38.

However, in consideration of errors by an apparatus, alignment of the electrode finger 110 on the light-receiving surface with the electrode finger 120 on the rear surface may be sometimes difficult. As shown in FIG. 39, misalignment of the electrode finger 110 and electrode finger 120 on the front and rear surfaces creates a shear stress, as indicated by an arrow (dot-and-dash line), on the solar cell 1 interposed between the finger electrodes 110, 120 and may produce cracks, in the worst case, resulting in yield reduction.

The present invention has been made in view of the above-described circumstances and has an object to provide a solar cell module with an improved yield.

Solution to Problem

The present invention directs to a solar cell module including a plurality of solar cells interconnected with wiring members. Each of the solar cells has a plurality of front-side finger electrodes that are disposed on a light-receiving surface of the solar cell and connected with the wiring members and a plurality of rear-side finger electrodes that are disposed on a rear surface of the solar cell and connected with the wiring members. The finger electrodes on at least one of the front side and rear side include auxiliary electrode sections in regions where the wiring members are to be connected and where the finger electrodes on the other side face. The auxiliary electrode sections cover the regions wider than regions where the finger electrodes on the other side are disposed.

Advantageous Effects of Invention

The present invention can provide a solar cell module with an improved yield.

DESCRIPTION OF EMBODIMENTS

Embodiments of the present invention will be described in detail with reference to the drawings. Through the drawings of the embodiments, like components are denoted by like numerals and will not be further explained.

Figure 1:
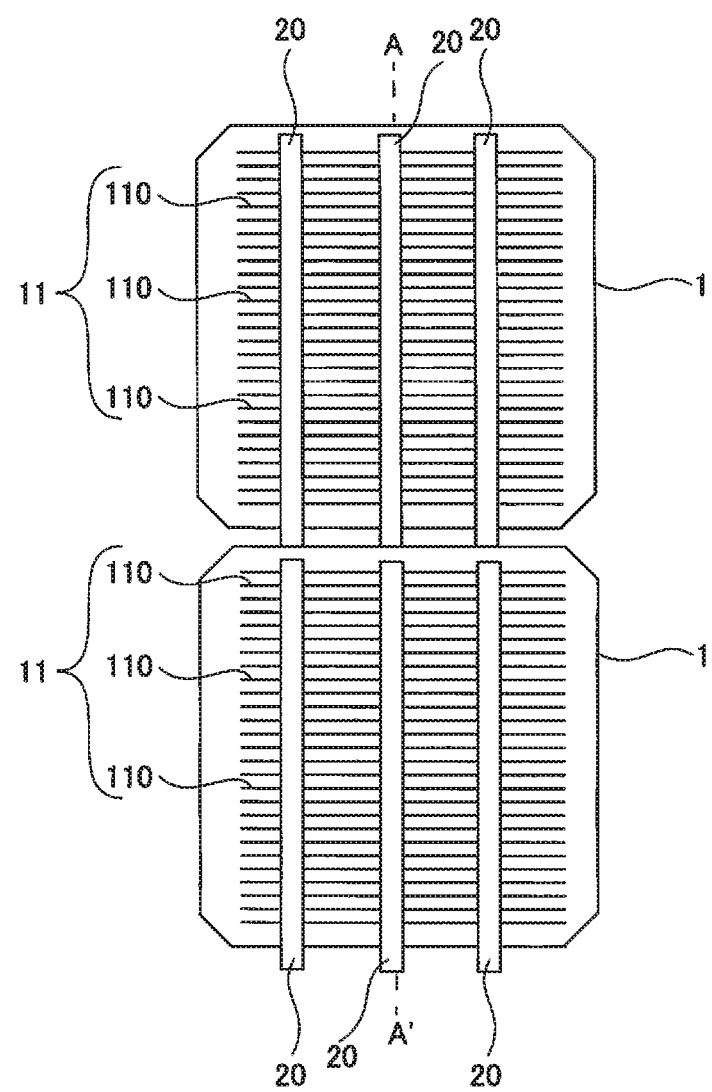
FIG. 1 is a plan view of solar cells in a solar cell module according to the first embodiment of the invention.
Figure 2:
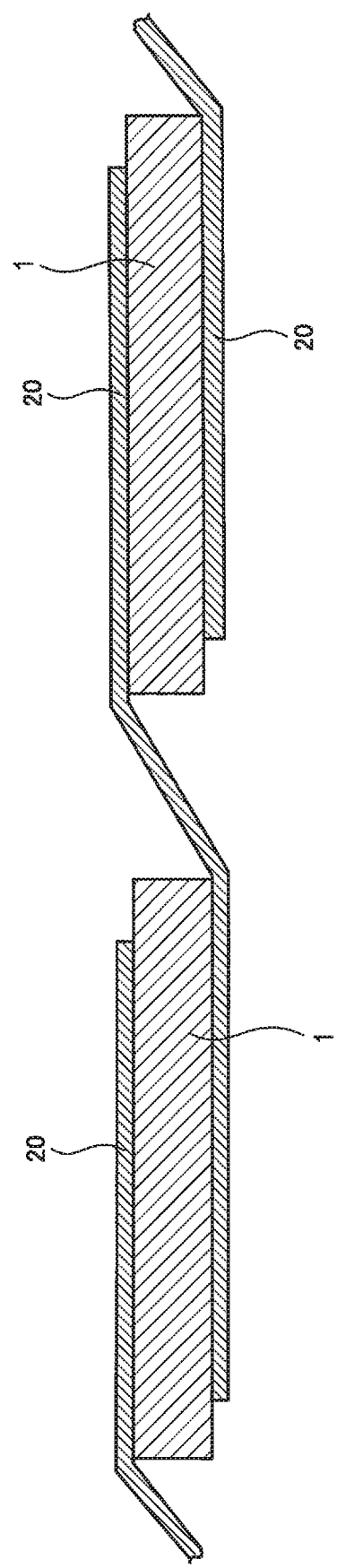
FIG. 2 is a cross-sectional view of the solar cells taken along line A-A' in FIG. 1.
Figure 3:
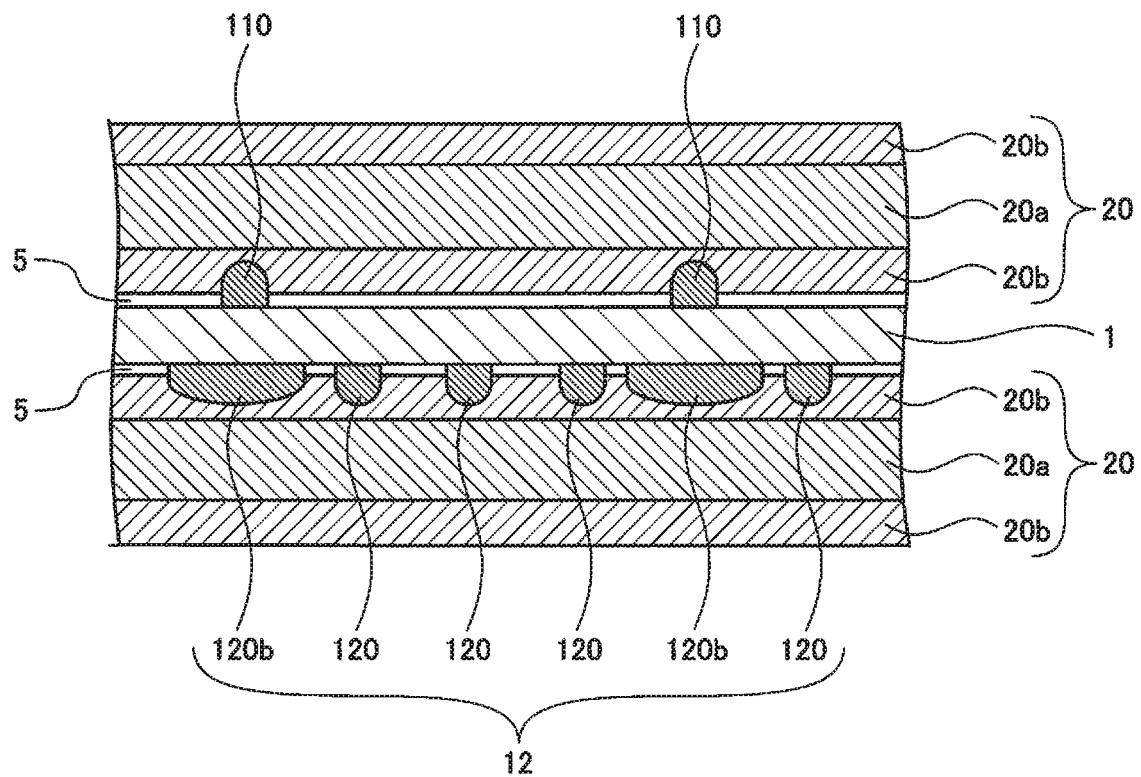
FIG. 3 is a schematic cross-sectional view showing a relevant part, of the solar cell, enlarged along the line A-A'.
Figure 4A:
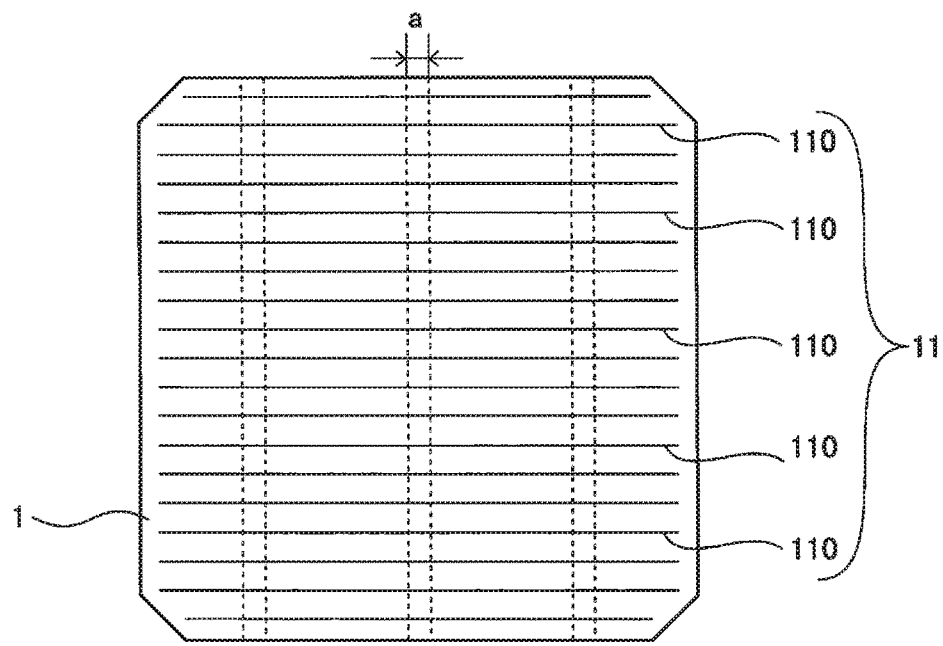
FIG. 4A is a plan view showing the solar cell, viewed from the light-receiving surface (front surface) side.
Figure 4B:
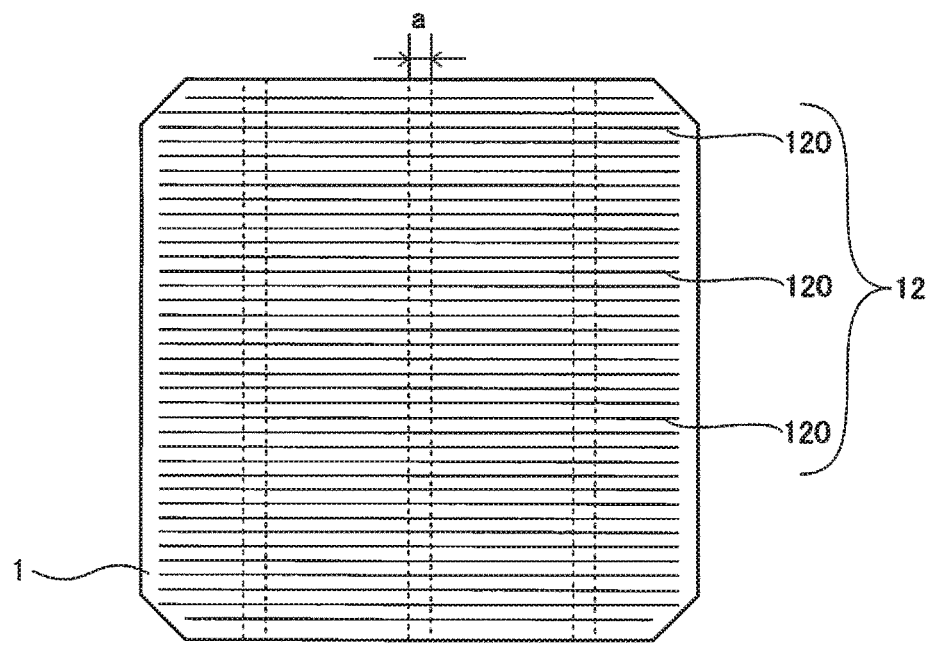
FIG. 4B is a plan view showing the solar cell, viewed from the rear surface side.
Figure 5:
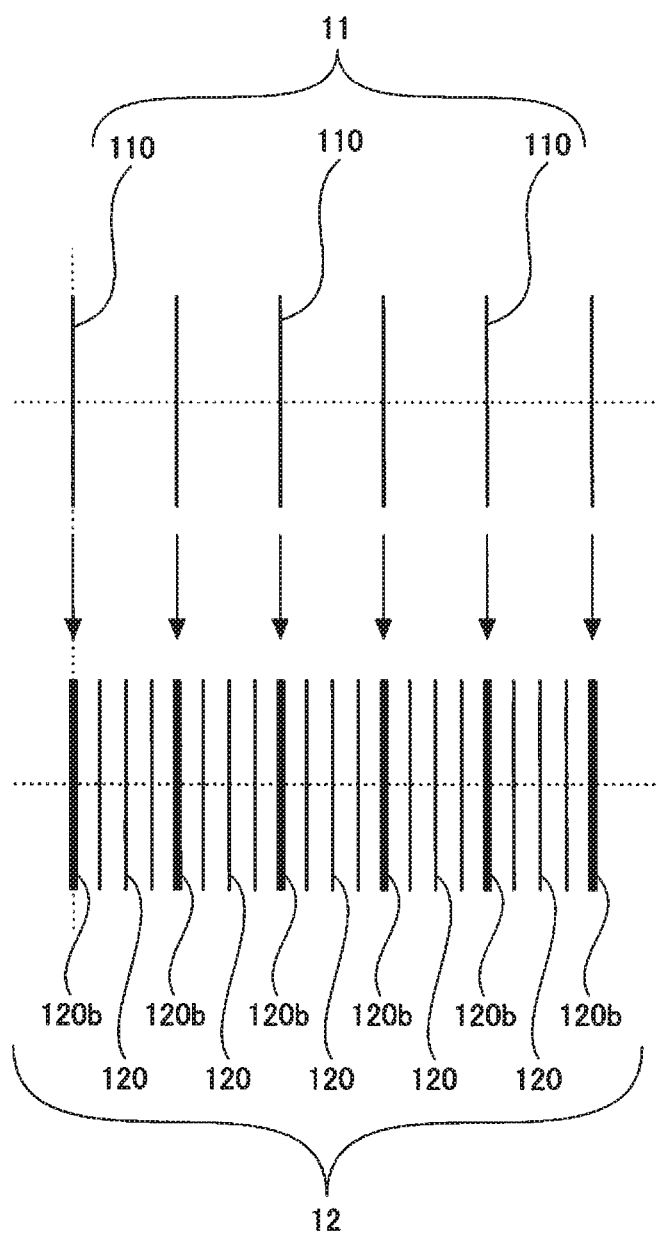
FIG. 5 is a schematic plan view showing a relevant part of the solar cell according to the first embodiment of the invention.

FIG. 1 is a plan view of solar cells of a solar cell module according to the first embodiment of the invention, FIG. 2 is a cross-sectional view of the solar cells taken along line A-A' in FIG. 1, FIG. 3 is a schematic cross-sectional view showing a relevant part, of the solar cell, enlarged along the line A-A', FIGS. 4A and 4B include plan views of the solar cell; FIG. 4A is viewed from the light-receiving surface side;

and FIG. 4B is viewed from the rear surface side, and FIG. 5 is a schematic plan view showing a relevant part of the solar cell.

The solar cell module includes a plurality of plate-like solar cells 1. Each of the solar cells 1 is, for example, made of a crystalline semiconductor, such as monocrystalline silicon and polycrystalline silicon, having a thickness of approximately 0.15 mm and is in the shape of roughly square of 125 mm on a side; however, the thickness, size and the other conditions are not limited thereto, and other types of solar cells are applicable. The solar cell 1 includes, for example, an n-type region, a p-type region, and a semiconductor junction formed at an interface between the n-type region and p-type region to create an electric field to separate carriers.

The solar cell 1 has a front-side electrode 11 on a light-receiving surface thereof. The front-side electrode 11 is composed of a plurality of finger electrodes 110 arranged in parallel with each other. For example, there are about 55 finger electrodes 110 each having a width of approximately 100 μm and all aligned with a pitch of approximately 2 mm. In addition, the solar cell 1 has a rear-side electrode 12 on a rear surface thereof. The rear-side electrode 12 includes a plurality of finger electrodes 120 arranged in parallel with each other. For example, there are about 217 finger electrodes 120 each having a width of 100 μm and all aligned with a pitch of approximately 0.5 mm. The front-side electrode 11 and rear-side electrode 12 can be formed by, for example, screen-printing with thermosetting or thermal sintering type silver paste. In addition to the screen-printing, evaporation method, sputtering, plating method or the like can be used to form the electrodes.

In this embodiment, three tabs are connected to the front-side electrode 11 and the rear-side electrode 12 each. FIGS. 4A, 4B and 5 indicate, by dashed lines, positions where tabs 20 are to be bonded. The tabs 20 will be connected perpendicularly to the finger electrodes 110, 120. In this embodiment, the tabs 20 have a width a of approximately 1.2 mm. Although it depends on the apparatuses to be used, an accuracy error of approximately 0.2 mm in position of the tab to be bonded is observed due to the apparatus accuracy.

As shown in FIGS. 3 to 5, the number of the finger electrodes 110 of the front-side electrode 11 is set to be less than that of the finger electrodes 120 of the rear-side electrode 12 in order to increase the amount of light incident to the light-receiving surface of the solar cell 1. Making the finger electrodes 110 of the front-side electrode 11 thicker than the finger electrodes 120 of the rear-side electrode 12 can reduce the resistance of the front-side electrode 11 and can also improve the solar cell characteristics. Any one of rear-side finger electrodes 120b is designed to be disposed on the rear surface at least at a position opposite to an electrode finger 110 on the front surface. In this embodiment, the finger electrodes on the front and rear surfaces are arranged so that one front-side electrode finger 110 faces one of four rear-side finger electrodes 120. In addition, the finger electrodes 120b on the rear surface are designed to be wide to occupy the positions opposite to the finger electrodes 110 of the front-side electrode 11 even if an error occurs in position of the electrodes to be formed. Specifically, the width of the rear-side electrode finger 120b facing the front-side electrode finger 110 is approximately 200 μm, which is twice as wide as the front-side electrode finger 110. The wide electrode finger 120b serves as an auxiliary electrode section having an area larger than that of the electrode finger 110.

In this embodiment, the rear-side finger electrodes 120 opposite to regions where the front-side finger electrodes 110 are absent have a width of approximately 100 μm as described above. In other words, the rear-side finger electrodes 120 not facing the front-side finger electrodes 110 are narrower than the rear-side finger electrodes 120b facing the front-side finger electrodes 110.

The present invention permits the width of every electrode finger 120 on the rear surface to be the same; however, the width difference reduces the difference in amount of silver used for the front-side electrode 11 and the rear-side electrode 12, thereby preventing the solar cell from curling due to the difference in the silver amount.

Next, a method of manufacturing a solar cell module with the above-described solar cells 1 will be described. In the solar cell module, as shown in FIGS. 1 to 3, the tabs 20, serving as wiring members, are electrically connected with the front-side electrode 11 and rear-side electrode 12. To connect the tabs 20 with the front-side electrode 11 and rear-side electrode 12, a resin adhesive is used. The resin adhesive is an adhesive resin film 5. The adhesive resin film can be, for example, an anisotropic conductive adhesive film, but is not limited thereto and can be an anisotropic conductive adhesive paste.

First, an adhesive resin film 5 is placed between a front-side electrode 11 and a tab 20 and between a rear-side electrode 12 and a tab 20 of a solar cell 1. The width of the adhesive resin film 5 is preferably the same as or less than the width of the tab 20 to be connected. For example, when the tab 20 is 0.5 mm to 3 mm in width, the adhesive resin film 5 is set to be 0.5 mm to 3 mm to match the tab 20. This embodiment employs three tabs 20 each having a width of 1.2 mm as shown in FIG. 1. To match the tabs 20, three adhesive resin films 5 each having a width corresponding to the width of the tabs 20 are placed on positions where the tabs 20 are to be adhered. In a case where the adhesive resin films 5 are made of something with a light transmitting property maintained after being cured, the adhesive resin films 5 can be made wider than the tabs 20.

The tab 20 includes a copper thin plate 20a that is preferably coated with tin, solder, or silver. In this embodiment, a tin-plating coating layer 20b is provided. This coating layer 20b is a soft conductor layer which is softer tan the finger electrodes 110, 120.

While the tabs 20 are pressed against the adhesive resin films 5, a heat treatment is performed to cure the adhesive layers of the adhesive resin films 5, thereby connecting the tabs 20 with the front-side electrode 11 and rear-side electrode 12.

If an anisotropic conductive adhesive film is employed as the adhesive resin film 5, the adhesive resin film 5 includes at least adhesive resin and conducting particles dispersed therein. The adhesive resin is made of a composition containing thermosetting resin, such as epoxy resin, phenoxy resin, acrylic resin, polyimide resin, polyamide resin, polycarbonate resin and polyurethane resin. These kinds of thermosetting resin can be used alone or as a mixture of the two or more. Preferably, the adhesive resin is composed of at least one kind of the thermosetting resin selected from the group including epoxy resin, phenoxy resin and acrylic resin.

The conducting particles can be, for example, metal particle, such as gold particles, silver particles, copper particles and nickel particles. Alternatively, the conducting particles can be conducting or insulating core particles, such as gold-plated particles, copper-plated particles and nickel-plated particles, coated with a conducting layer, such as a metal layer.

To electrically connect each of the solar cells 1 to adjacent solar cells 1 with the tabs 20, the tabs 20 are arranged on the adhesive resin films 5 placed on the front and rear surfaces of the solar cells 1 so that one end of the each tab 20 is connected to the front-side electrode 11 of a given solar cell 1, while the other end of the tab 20 is connected to the rear-side electrode 12 of another solar cell adjacent to the given solar cell 1.

Figure 7:
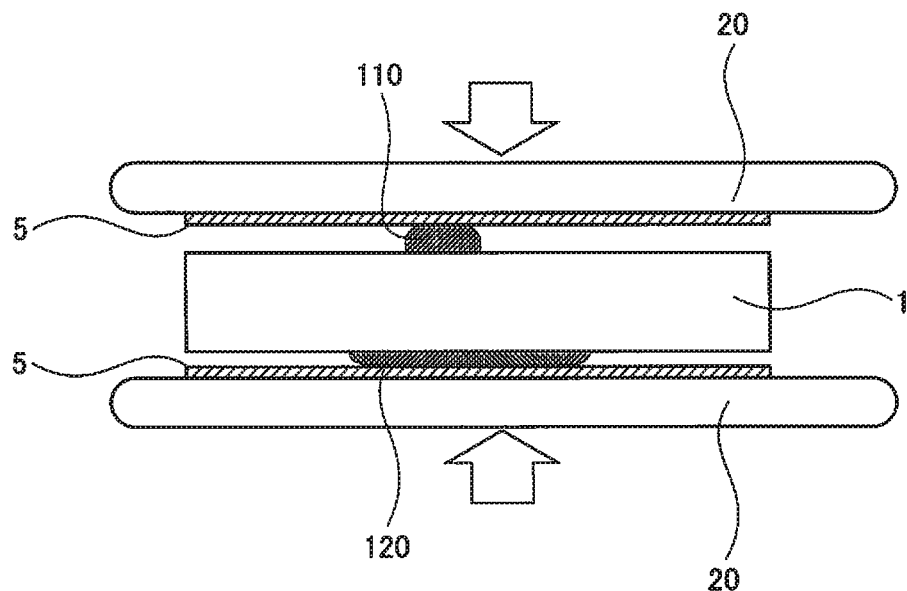
FIG. 7 is a schematic view showing a tab connecting process of the solar cell module according to the invention.

As shown in FIG. 7, for example, a solar cell 1 mounted on a hot plate is pressed with a heater block at a pressure of approximately 3 MPa to press tabs 20 against the solar cell 1 with the adhesive resin films 5. Then, the temperature of the heater block and hot plate is increased to, for example, 120° C. to 280° C., or more preferably to 120° C. to 200° C., which is sufficient to cure the adhesive resin component in the adhesive resin film 5, to thermocompressively bond the tabs 20 and electrically connect the solar cells 1 into an array.

The aforementioned embodiment employs an anisotropic conductive resin film as the adhesive resin film 5; however, the adhesive resin film 5 can be an insulating adhesive resin film without conducting particles. Electrical connection using the insulating resin adhesive is made by making direct contact between a part of surfaces of the front-side and rear-side electrodes 11, 12 and the surface of the tab 20. In this case, it is preferable to use, as a tab 20, a conductor, such as a copper foil, coated with a conducting film, such as tin (Sn) and solder, which is softer than the collector electrodes 11, 12 and connect so that parts of the front-side electrode 11 and rear-side electrode 12 dig into the conducting film.

Figure 6:
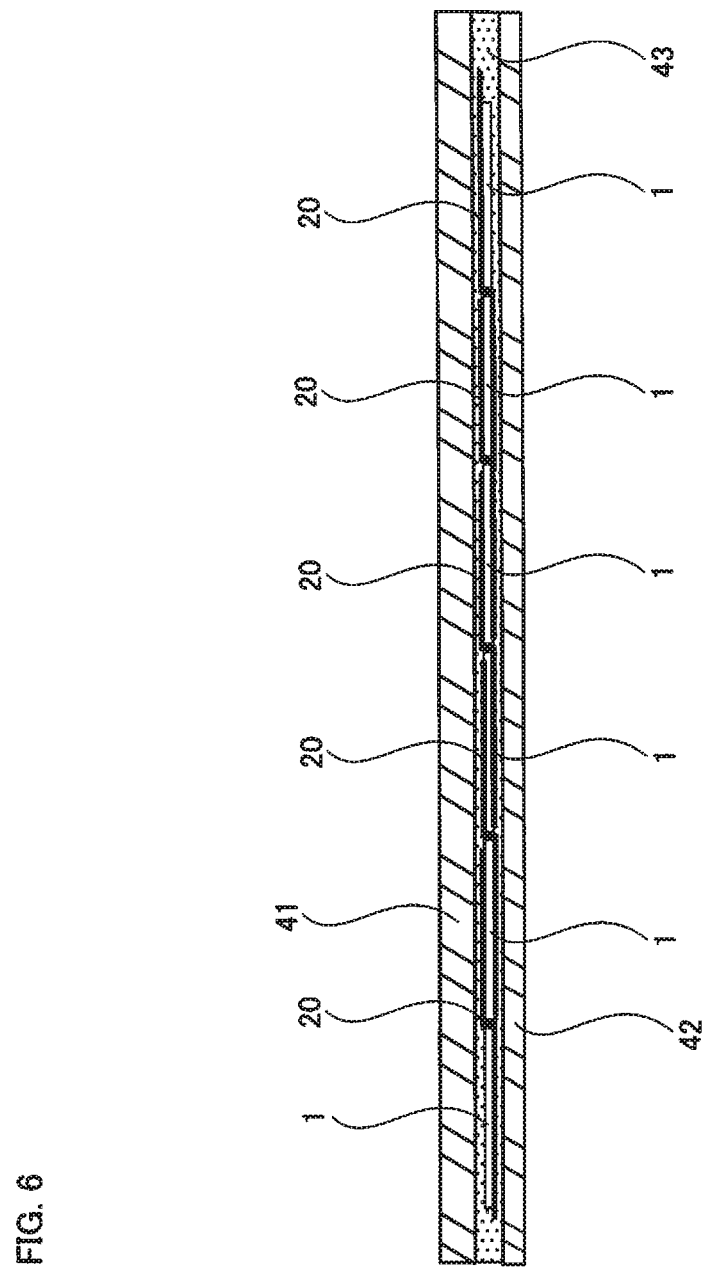
FIG. 6 is a simplified cross-sectional view of a solar cell module according to the invention.

The plurality of solar cells 1 thus connected with the tabs 20 are placed between a glass front-side member 41 and a rear-side member 42, which is made of a material like a weatherproof film, glass or plastic, so that the front-side electrode 11 faces the front-side member 41 and the rear-side electrode 12 faces the rear-side member 42, with light-transmitting sealing sheets, such as EVA, placed so as to sandwich the solar cells. Then, the solar cells 1 interposed between the front-side member 41 and rear-side member 42 are encapsulated with the sealing member 43 by a laminating machine, thereby obtaining a solar cell module as shown in FIG. 6.

The above-described solar cell module is inserted in a frame, which is made of aluminum or the like, with a sealing material applied to the outer peripheral of the solar cell module, if needed. The frame is made of aluminum, stainless steel, a roll-formed steel plate or the like. If necessary, a terminal box (not shown) is provided, for example, on a surface of the rear-side member 42.

In the solar cell module of the first embodiment, the finger electrodes 120 on the rear surface include wide auxiliary electrode sections 120b in regions where the front-side finger electrodes face and the tabs 20 are to be disposed. Even if a mechanical error occurs, the auxiliary electrode sections 120b are present on the rear surface at positions opposite to the front-side finger electrodes 110. As a result, pressure applied during thermocompressively bonding can be received by the finger electrodes 110 and auxiliary electrode sections 120b, thereby relieving shear stresses. This can reduce malfunctions in the solar cell module caused by cracks produced in the solar cells 1 during thermocompression bonding.

In addition, the rear-side finger electrodes 120 not facing the front-side finger electrodes 110 are formed thinner. Selecting the line width of the finger electrodes 120 on the rear surface can stop wasting unnecessary silver paste used to form the electrodes and therefore can prevent an increase in cost.

Furthermore, provision of the thin finger electrodes to the finger electrodes 120 on the rear surface can reduce stresses on the solar cells and therefore can reduce the amount of curling in the solar cells. Consequently, yield improvement can be achieved.

Figure 8:
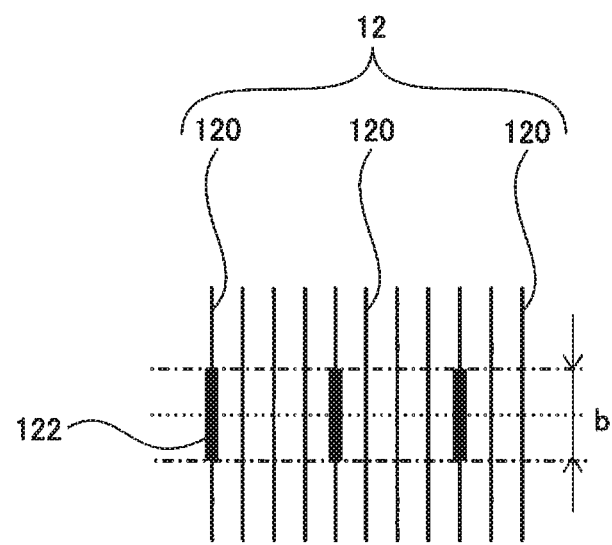
FIG. 8 is a schematic plan view of a solar cell which is a modification of the first embodiment of the invention.

A modification of the first embodiment of the invention will be shown in FIG. 8 and described. The aforementioned embodiment employs the rear-side finger electrodes 120 that are formed wide throughout their length in the region opposite to the front-side electrode finger 110. In comparison with the wide rear-side finger electrodes, the embodiment shown in FIG. 8 shows that the rear-side finger electrodes 120 of the solar cell 1 includes wide auxiliary electrode sections 122 only in regions where the front-side finger electrodes 110 face and the tabs 20 are to be disposed. The auxiliary electrode sections 122 have a length sufficient to cover the region slightly wider than the width of the tab 20 in consideration of mechanical errors or the like to be made during tab bonding. For example, when the width a of a tab 20 is 1.2 mm, an auxiliary electrode section 122 capable of covering a space of 1.6 mm (b in FIG. 8) is provided to allow for an error of ±0.2 mm that may occur during positioning of the tab and is determined by machine accuracy.

Since the auxiliary electrode sections 122 are provided to only the positions where the finger electrodes 110, 120 on the front and rear surfaces of the solar cell 1 face each other and the tabs 20 are to be disposed, the positions opposite to the front-side finger electrodes 110 are occupied by the auxiliary electrode sections 122 of the finger electrodes 120 on the rear surface even if a mechanical error occurs. Consequently, pressure applied during thermocompression bonding can be received by the finger electrodes 110 and auxiliary electrode sections 122 on the front and rear surfaces, thereby relieving shear stresses. In addition, since the electrodes do not need to be wide throughout their length, the amount of silver paste used to form the electrodes can be reduced. In addition, reduction of the stress applied on the solar cell by the finger electrodes can reduce the amount of curling in the solar cell, which leads the yield improvement. If the solar cell 1 is a type of a solar cell also receiving light on its rear surface, a loss caused by the rear-side finger electrodes 120 blocking light can be reduced.

Figure 9:
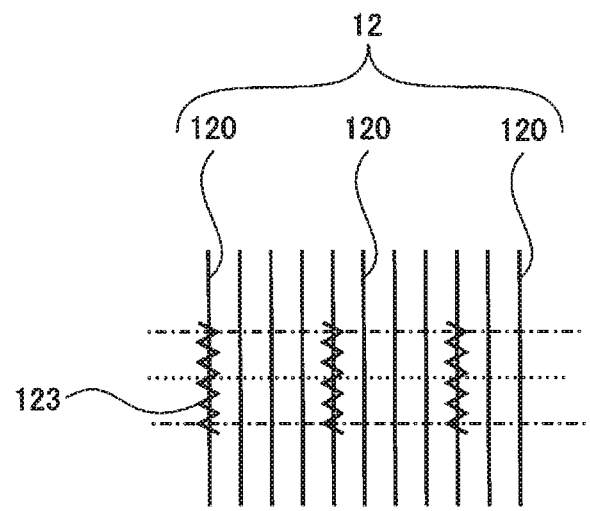
FIG. 9 is a schematic plan view of a solar cell which is a modification of the first embodiment of the invention.

FIGS. 9 to 14 are schematic views of modifications of the auxiliary electrode sections. FIG. 9 shows a form in which zigzag auxiliary electrode sections 123 are provided to rear-side finger electrodes 120 of a solar cell 1, in regions where front-side finger electrodes 110 face and tabs 20 are to be disposed. Each of the auxiliary electrode sections 123 has a length that is the same as the length (b) of the auxiliary electrode sections shown in FIG. 8 to allow for the mechanical error to be made during tab bonding.

Figure 10:
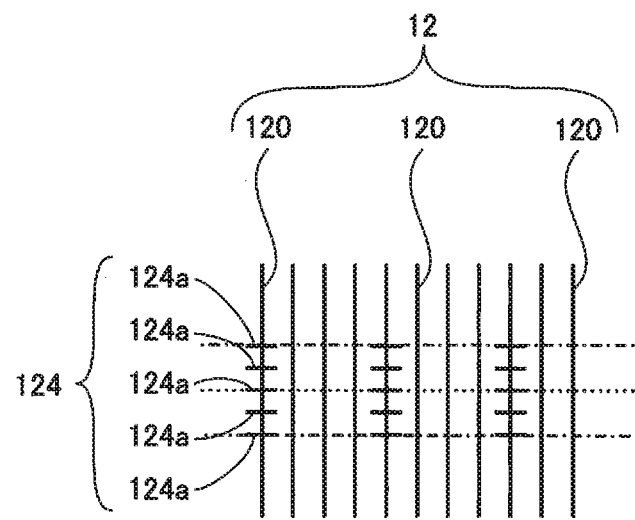
FIG. 10 is a schematic plan view of a solar cell which is a modification of the first embodiment of the invention.

FIG. 10 shows a form in which auxiliary electrode sections 124 including a plurality of electrode lines 124a that extend in parallel with the longitudinal direction of the tabs 20 are provided to the rear-side finger electrodes 120 of a solar cell 1, in regions where the front-side finger electrodes 110 face and tabs 20 are to be disposed. The length of an auxiliary electrode section 124 is defined as the length of a part, including the electrode lines 124a, of an electrode finger 120 and is the same as the length (b) of the auxiliary electrode sections shown in FIG. 8 to allow for the mechanical error to be made during tab bonding.

Figure 11:
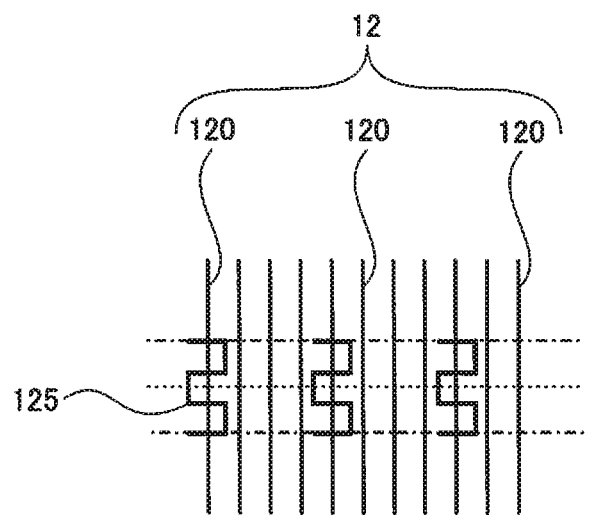
FIG. 11 is a schematic plan view of a solar cell which is a modification of the first embodiment of the invention.

FIG. 11 shows a form in which auxiliary electrode sections 125 in the shape of rectangular pulses are provided to the rear-side finger electrodes 120 of a solar cell 1, in regions where the front-side finger electrodes 110 face and tabs 20 are to be disposed. Each of the auxiliary electrode sections 125 has a length that is the same as the length (b) of the auxiliary electrode sections shown in FIG. 8 to allow for the mechanical error to be made during tab bonding.

Figure 12:
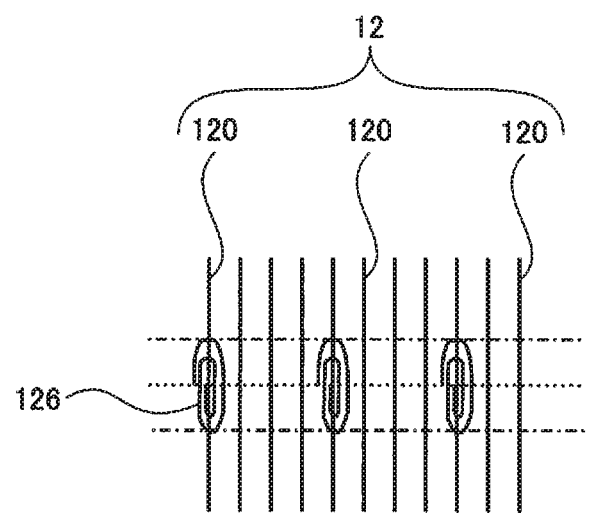
FIG. 12 is a schematic plan view of a solar cell which is a modification of the first embodiment of the invention.

FIG. 12 shows a form in which auxiliary electrode sections 126 in the shape of a spiral are provided to the rear-side finger electrodes 120 of a solar cell 1, in regions where the front-side finger electrodes 110 face and tabs 20 are to be disposed. Each of the auxiliary electrode sections 126 has a length that is the same as the length (b) of the auxiliary electrode sections shown in FIG. 8 to allow for the mechanical error to be made during tab bonding.

Figure 13:
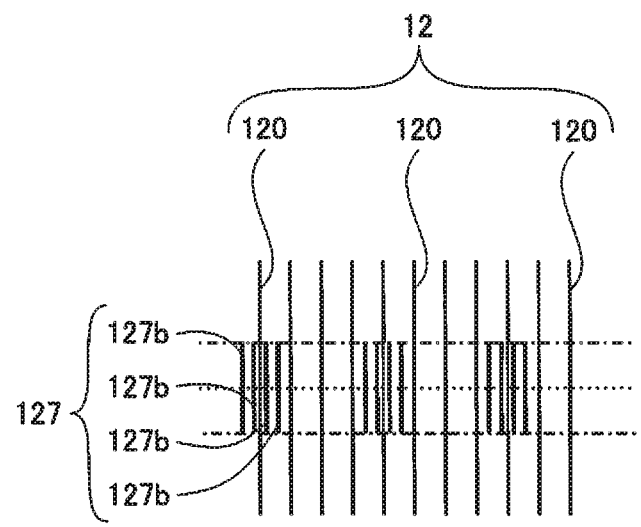
FIG. 13 is a schematic plan view of a solar cell which is a modification of the first embodiment of the invention.

FIG. 13 shows a form in which auxiliary electrode sections 127 including a plurality of electrode lines 127b that extend in parallel with the finger electrodes are provided to the rear-side finger electrodes 120 of a solar cell 1, in regions where the front-side finger electrodes 110 face and tabs 20 are to be disposed. Each of the auxiliary electrode sections 127 has a length that is the same as the length (b) of the auxiliary electrode section shown in FIG. 8 to allow for the mechanical error to be made during tab bonding.

Figure 14:
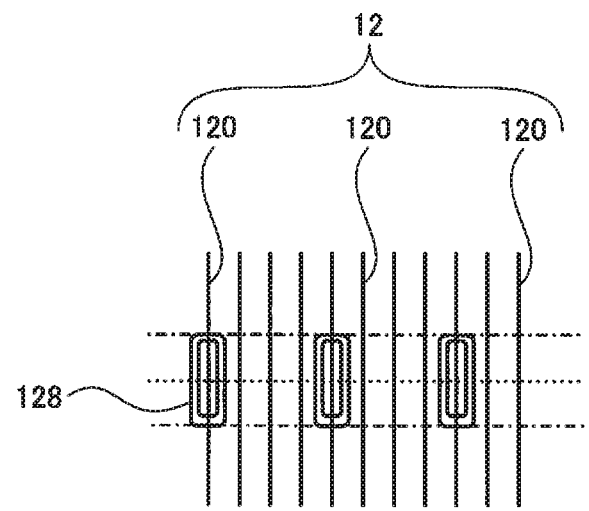
FIG. 14 is a schematic plan view of a solar cell which is a modification of the first embodiment of the invention.

FIG. 14 shows a form in which auxiliary electrode sections 128 in the shape of a rectangular frame are provided to the rear-side finger electrodes 120 of a solar cell 1, in regions where the front-side finger electrodes 110 face and tabs 20 are to be disposed. Each of the auxiliary electrode sections 128 has a length that is the same as the length (b) of the auxiliary electrode sections shown in FIG. 8 to allow for the mechanical error to be made during tab bonding.

As appreciated from the auxiliary electrode sections shown from FIGS. 9 to 14, the finger electrodes 120 on the rear surface include the wide auxiliary electrode sections in regions where the front-side finger electrodes 110 face and the tabs 20 are to be disposed. Even if a mechanical error occurs, the regions opposite to the front-side finger electrodes 110 are occupied by the rear side auxiliary electrode sections. Consequently, these modifications provide the same effect as described above.

Figure 15:
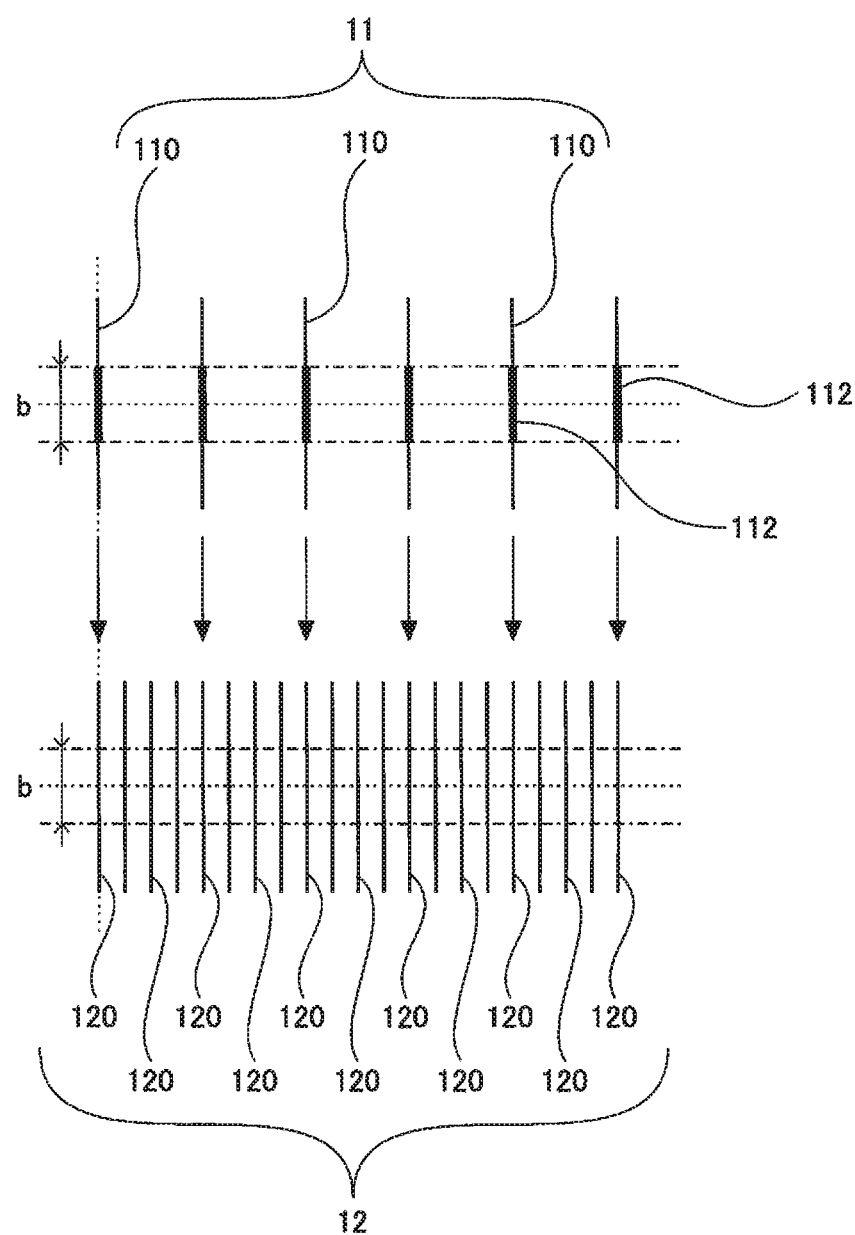
FIG. 15 is a schematic plan view showing a relevant part of a solar cell according to the second embodiment of the invention.
Figure 16:
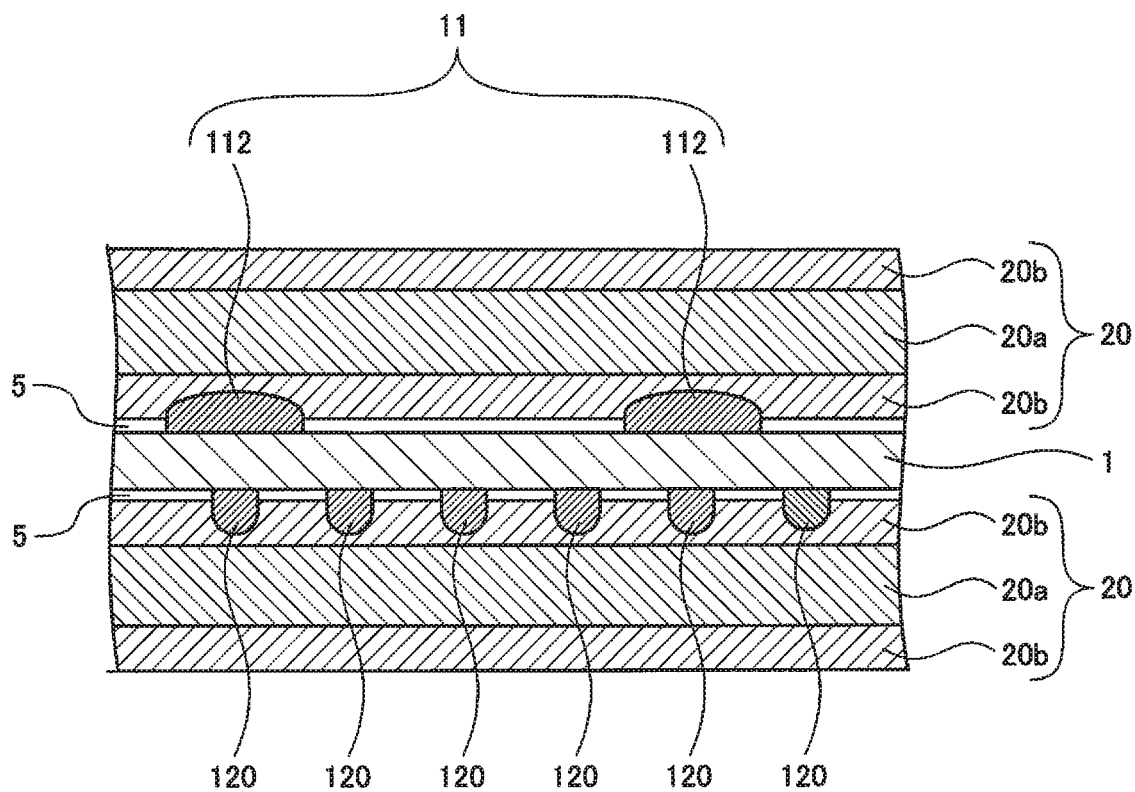
FIG. 16 is a schematic cross-sectional view showing the enlarged relevant part of the solar cell according to the second embodiment of the invention.

The second embodiment according to the present invention will be described. FIG. 15 is a schematic plan view showing a relevant part of a solar cell of the invention; and FIG. 16 is a schematic cross-sectional view showing the relevant part enlarged. Even if the finger electrodes are formed wide at the positions where tabs 20 are to be bonded, the wide parts are covered by the tabs 20. In the second embodiment, the finger electrodes 11 on the light-receiving surface are configured to include auxiliary electrode sections 112 at the positions where the tabs 20 are to be disposed. Specifically, front-side finger electrodes 110 include auxiliary electrode sections in regions where the rear-side finger electrodes 120 face and the tabs 20 are to be disposed. The auxiliary electrode sections 112 are formed slightly longer than the width of the tabs 20 in consideration of mechanical errors to be made during tab bonding. For example, when the width a of a tab 20 is 1.2 mm, an auxiliary electrode section 112 capable of covering a space of 1.6 mm (b in FIG. 17) is provided to allow for an error of ±0.2 mm that may occur during positioning of the tab and is determined by machine accuracy.

Since the auxiliary electrode sections 112 are provided to the front-side finger electrodes 110 only in regions where the rear-side finger electrodes 120 of the solar cell 1 face and the tabs 20 are to be disposed, as shown in FIGS. 15 and 16, the regions of the front-side finger electrodes 110 opposite to the rear-side finger electrodes 120 are occupied by the auxiliary electrode sections 112 even if a mechanical error occurs. As a result, pressure applied during thermocompression bonding can be received by the finger electrodes 120 and the auxiliary electrode sections 112 on the front and rear surfaces, thereby relieving the shear stresses.

In addition, since the front-side finger electrodes 110 include the auxiliary electrode sections 112 at the positions where the tabs 20 are to be bonded, the auxiliary electrode sections 112 do not inhibit entrance of light to the light-receiving surface of the solar cell 1. Furthermore, since the auxiliary electrode sections 112 are provided on the front surface on which a fewer number of the finger electrodes are provided, the difference in volume between the finger electrodes on the front and rear surfaces decreases and therefore stress applied by the finger electrodes to the solar cell decreases, thereby reducing the amount of curling in the solar cells. Consequently, yield improvement can be achieved.

Figure 17:
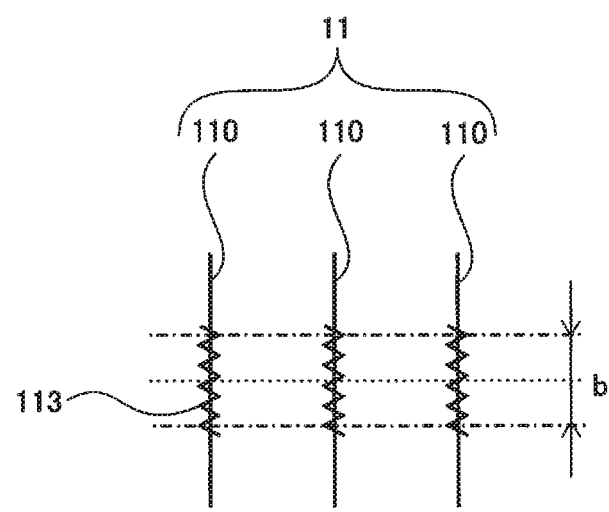
FIG. 17 is a schematic plan view of a solar cell, which is a modification according to the second embodiment of the invention.

FIGS. 17 to 22 are schematic views of modifications of the auxiliary electrode sections formed on the front surface. FIG. 17 shows a form in which zigzag auxiliary electrode sections 113 are provided to front-side finger electrodes 110 of a solar cell 1, in regions where rear-side finger electrodes 120 face and tabs 20 are to be disposed. Each of the auxiliary electrode sections 113 has a length that is the same as the length (b) of the auxiliary electrode section shown in FIG. 15 to allow for the mechanical error to be made during tab bonding.

Figure 18:
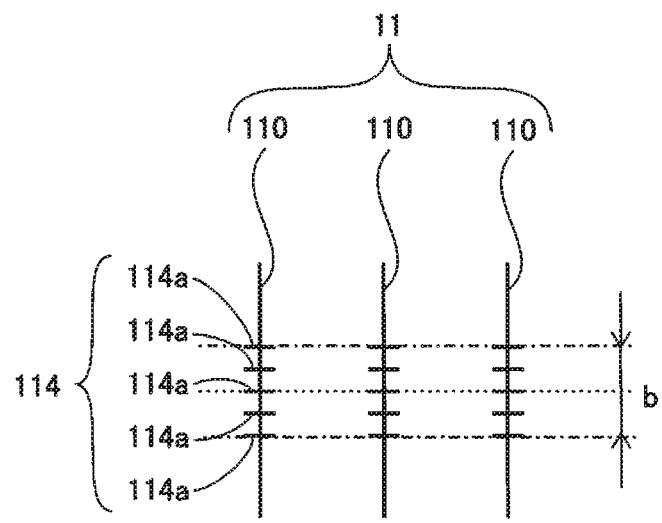
FIG. 18 is a schematic plan view of a solar cell, which is a modification according to the second embodiment of the invention.

FIG. 18 shows a form in which auxiliary electrode sections 114 including a plurality of electrode lines 114a that extend in parallel with the tabs 20 are provided to the front-side finger electrodes 110 of a solar cell 1, in regions where rear-side finger electrodes 120 face and tabs 20 are to be disposed. The length of an auxiliary electrode section 114 is defined as the length of a part, including the electrode lines 114a, of an electrode finger 110 and is the same as the length (b) of the auxiliary electrode section shown in FIG. 15 to allow for the mechanical error to be made during tab bonding.

Figure 19:
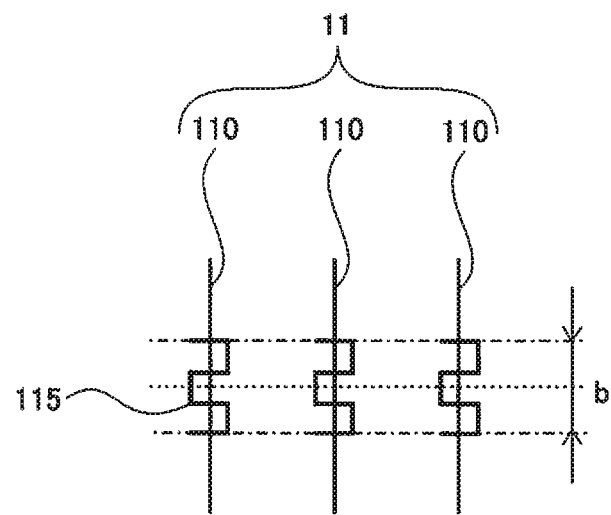
FIG. 19 is a schematic plan view of a solar cell, which is a modification according to the second embodiment of the invention.

FIG. 19 shows a form in which auxiliary electrode sections 115 in the shape of rectangular pulses are provided to the front-side finger electrodes 110 of a solar cell 1, in regions where rear-side finger electrodes 120 face and tabs 20 are to be disposed. Each of the auxiliary electrode sections 115 has a length that is the same as the length (b) of the auxiliary electrode sections shown in FIG. 15 to allow for the mechanical error to be made during tab bonding.

Figure 20:
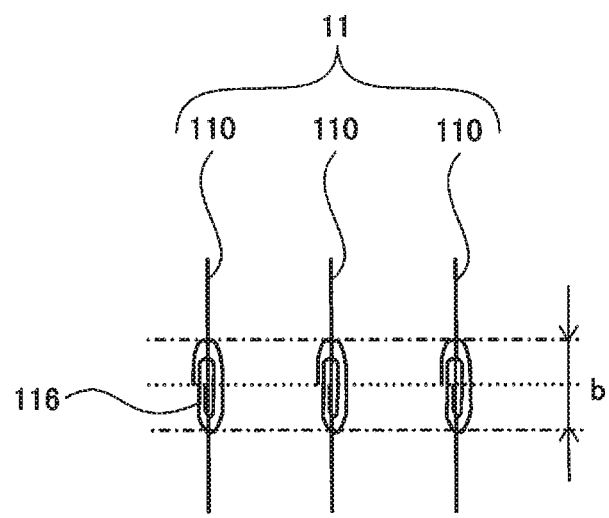
FIG. 20 is a schematic plan view of a solar cell, which is a modification according to the second embodiment of the invention.

FIG. 20 shows a form in which auxiliary electrode sections 116 in the shape of a spiral are provided to the front-side finger electrodes 110 of a solar cell 1, in regions where rear-side finger electrodes 120 face and tabs 20 are to be disposed. Each of the auxiliary electrode sections 116 has a length that is the same as the length (b) of the auxiliary electrode sections shown in FIG. 15 to allow for the mechanical error to be made during tab bonding.

Figure 21:
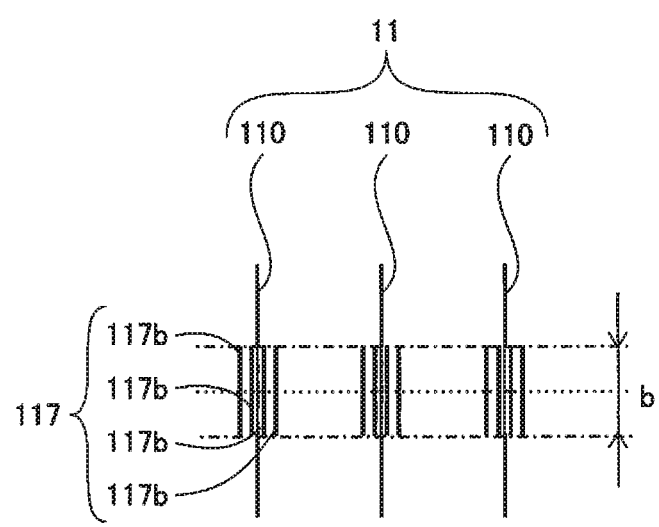
FIG. 21 is a schematic plan view of a solar cell, which is a modification according to the second embodiment of the invention.

FIG. 21 shows a form in which auxiliary electrode sections 117 including a plurality of electrode lines 117b that extend in parallel with the finger electrodes are provided to the front-side finger electrodes 110 of a solar cell 1, in regions where rear-side finger electrodes 120 face and tabs 20 are to be disposed. Each of the auxiliary electrode sections 117 has a length that is the same as the length (b) of the auxiliary electrode sections shown in FIG. 15 to allow for the mechanical error to be made during tab bonding.

Figure 22:
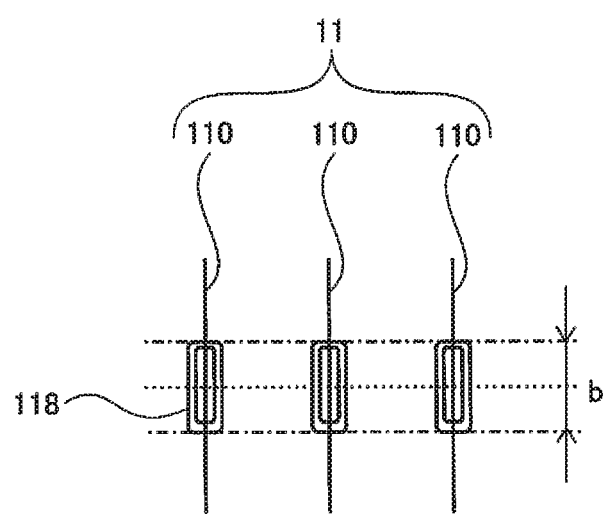
FIG. 22 is a schematic plan view of a solar cell, which is a modification according to the second embodiment of the invention.

FIG. 22 shows a form in which auxiliary electrode sections 118 in the shape of a rectangular frame are provided to the front-side finger electrodes 110 of a solar cell 1, in regions where rear-side finger electrodes 120 face and tabs 20 are to be disposed. Each of the auxiliary electrode sections 118 has a length that is the same as the length (b) of the auxiliary electrode sections shown in FIG. 15 to allow for the mechanical error to be made during tab bonding.

As appreciated from the auxiliary electrode sections shown from FIGS. 17 to 22, the finger electrodes 110 on the front surface include the auxiliary electrode sections only in regions where the rear-side finger electrodes 120 of the solar cell 1 face and the tabs 20 are to be disposed. Even if a mechanical error occurs, the regions of the front-side finger electrodes 110 facing the rear-side finger electrodes 120 are occupied by the auxiliary electrode sections. As a result, these modifications provide the same effect as the above-described embodiment.

Figure 23A:
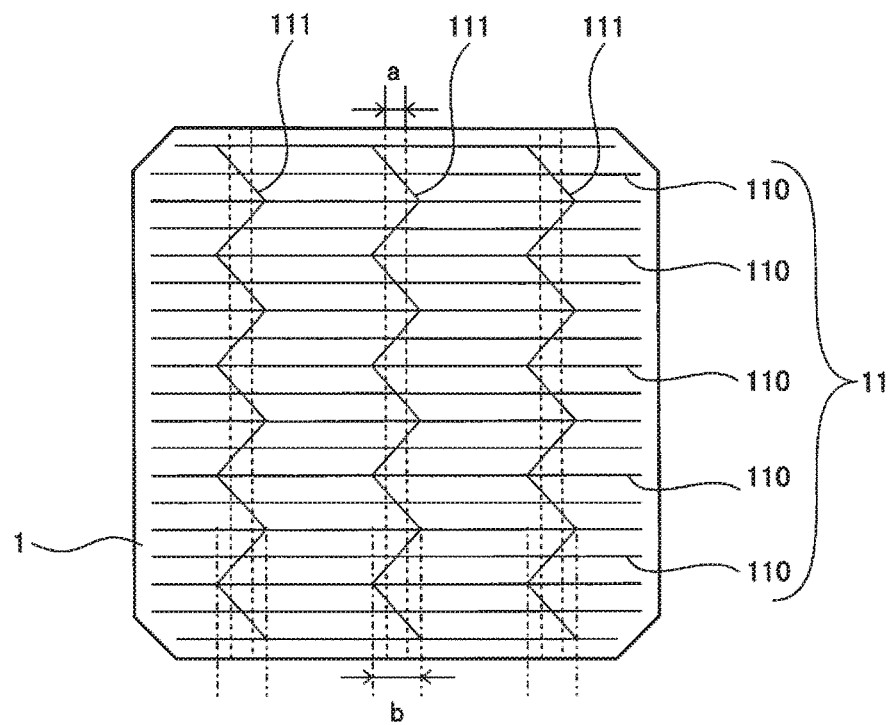
FIG. 23A is a plan view showing a solar cell according to the third embodiment of the invention, viewed from the light-receiving surface (front surface) side.
Figure 23B:
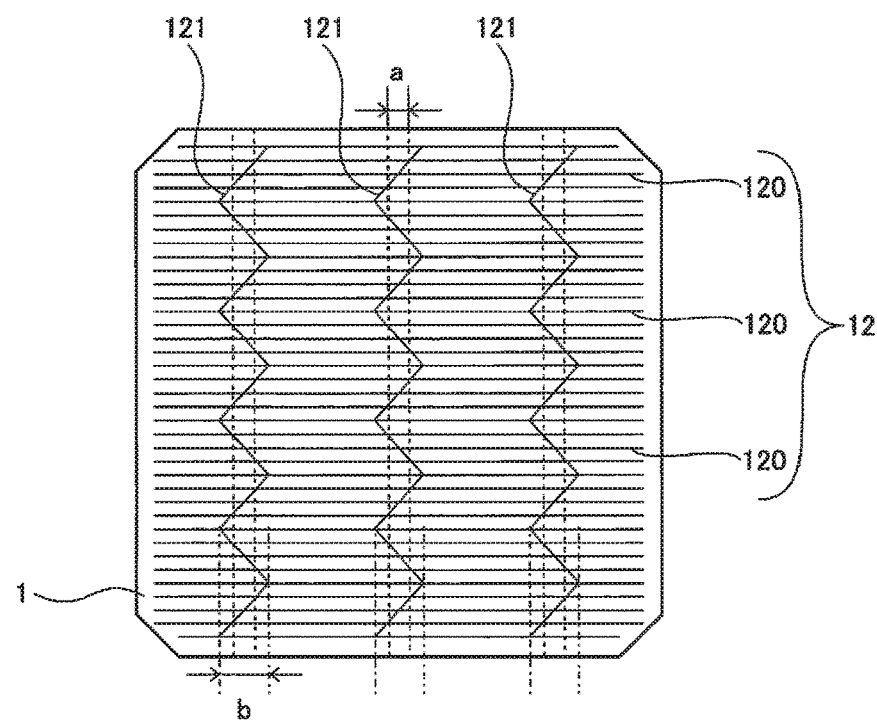
FIG. 23B is a plan view showing a solar cell according to the third embodiment of the invention, viewed from the rear surface side.
Figure 24:
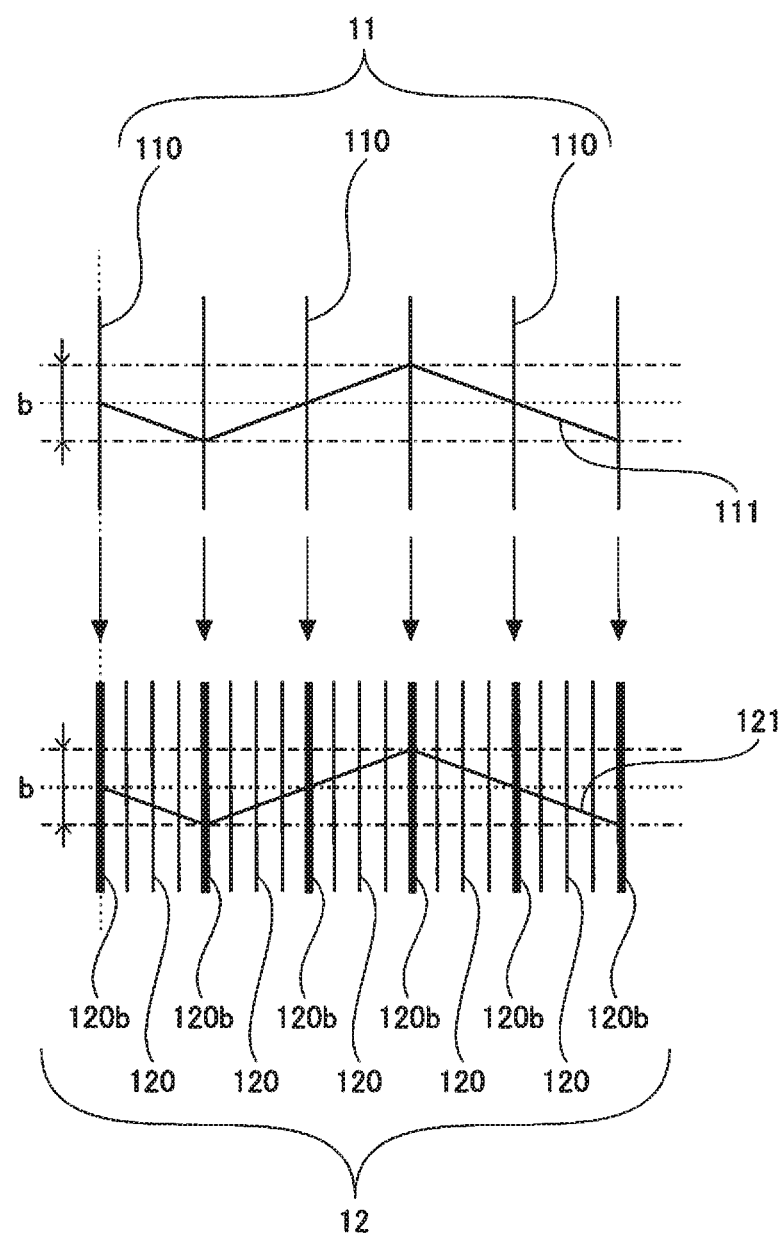
FIG. 24 is a schematic plan view showing a relevant part of the solar cell according to the third embodiment of the invention.

Adherability of the wiring members and good electrical connection between the finger electrodes 110, 120 and the tabs 20 can be achieved by providing bus-bar electrodes. This invention is applicable to solar cell modules with the bus-bar electrodes. The third embodiment, using the bus-bar electrodes, of the present invention will be described below. FIGS. 23A and 23B include plan views of a solar cell according to the third embodiment: FIG. 23A is viewed from the light-receiving surface side; and FIG. 23B is viewed from the rear surface side. FIG. 24 is a schematic plan view showing a relevant part of the solar cell.

As shown in FIGS. 23A, 23B and 24, a front-side electrode 11 is provided with bus-bar electrodes 111 that are aligned with positions where tabs are to be connected. These bus-bar electrodes 111 are electrically connected with all finger electrodes 110. As described above, when the width a of the tab 20 is 1.2 mm, a zigzag bus-bar electrode 111 is provided within a space of 1.6 mm (b in FIGS. 23A. 23B), which is slightly wider than the width of the tab 20 to allow for a total error of ±0.2 mm of: an error that may occur during positioning of the tab and is determined by machine accuracy; and a position accuracy error in the bus-bar electrode. The bus-bar electrodes 111 are arranged within ranges indicated by dot-and-dash lines in FIGS. 23A and 23B and defined in consideration of the mechanical error in the tab 20. Specifically, the bus-bar electrodes 111 extend leftward in a slanting direction from the center position in the drawings, are bent rightward in a slanting direction upon reaching a point 0.8 mm left from the center position, and extend 1.6 mm from a left end to a right end. Then, the bus-bar electrodes 111 are bent leftward upon reaching the right end, resulting in the zigzag shape extending in the direction in which the tabs are to be bonded. This embodiment employs three bus-bar electrodes 111.

In this embodiment, a zigzag pattern is formed at intervals of five finger electrodes 110.

In the third embodiment, the number of the finger electrodes 110 of the front-side electrode 11 is also set to be less than the number of the finger electrodes 120 of the rear-side electrode 12. As with the case of the front-side electrode 11, bus-bar electrodes 121 are provided to the rear-side electrode 12. These bus-bar electrodes 121 are formed in the zigzag shape that is the same as the bus-bar electrodes 111 on the front surface. The bus-bar electrodes 121 are electrically connected with all the finger electrodes 120. The bus-bar electrodes 111 of the front-side electrode 11 and the bus-bar electrodes 121 of the rear-side electrode 12 are formed at positions where they overlap each other. In other words, the bus-bar electrodes 111, 121 are arranged so that the rear-side bus-bar electrodes 121 on the rear surface of the solar cell 1 are opposed to the front-side bus-bar electrodes 111.

Also in this embodiment, the rear-side finger electrodes 120 include wide auxiliary electrode sections 120b in regions where the front-side finger electrodes 110 face and the tabs 20 are to be disposed. Specifically, the width of the finger electrodes 120b that face the front-side finger electrodes are set to approximately 200 μm, which is twice as wide as the other finger electrodes 120.

This embodiment also provides the same effect as the above-described embodiments.

Next, a method of manufacturing a solar cell module with the solar cells 1 will be described. In the solar cell module, as shown in FIGS. 1 and 2, tabs 20, serving as wiring members, are electrically connected with the front-side electrode 11 and rear-side electrode 12. To connect these tabs 20 to the front-side electrode 11 and rear-side electrode 12, adhesive resin films 5 are used.

First, each of the adhesive resin films 5 is placed between the front-side electrode 11 and tabs 20 and between the rear-side electrode 12 and tabs 20 of the solar cell 1. The adhesive resin films 5 to be thermocompressively bonded preferably have a width the same as or slightly narrower than the width of the tabs 20 to be connected. As shown in FIG. 1, this embodiment employs three tabs 20 each having a width of 1.2 mm, and therefore three conductive adhesive films 5 each having a width corresponding to the width of the tabs 20 are adhered at positions where the tabs 20 are to be bonded on the bus-bar electrodes 111, 121 of the solar cell 1. In a case where the adhesive resin films 5 are made of something with a light transmitting property maintained after being cured, the adhesive resin films 5 can be made wider than the tabs 20.

As with the case of the first embodiment, the tab 20 includes a copper thin plate with a tin-plating coating layer. This coating layer is a soft conductor layer which is softer than the finger electrodes 110, 120.

While the tabs 20 are pressed against the adhesive resin films 5, a heat treatment is performed to cure the adhesive layers of the adhesive resin films 5, thereby connecting the tabs 20 with the front-side electrode 11 and rear-side electrode 12.

To electrically connect each of the solar cells 1 to adjacent solar cells 1 with the tabs 20, the tabs 20 are arranged on the adhesive resin films 5 placed on the front and rear surfaces of the solar cell 1 so that one end of the each tab 20 is connected to the front-side electrode 11 of a given solar cell 1, while the other end of the tab 20 is connected to the rear-side electrode 12 of another solar cell adjacent to the given solar cell 1.

As shown in FIG. 7, for example, a solar cell 1 mounted on a hot plate is pressed with a heater block at a pressure of approximately 3 MPa to press tabs 20 against the solar cell 1 with the adhesive resin film 5. Then, the temperature of the heater block and hot plate is increased to be high, for example, 120° C. to 280° C., or more preferably to 120° C. to 200° C., which is sufficient to cure the resin component, to thermocompressively bond the tabs 20 and electrically connect the solar cells 1 into an array.

In the third embodiment, some parts of the zigzag bus-bar electrodes 111, 121 are arranged in the regions where the tabs 20 are to be connected. The bus-bar electrodes 111, 121 make excellent electrical connections with the tabs 20. In other regions where the finger electrodes 110, 120 are absent, the bus-bar electrodes 111, 121 are connected to the tabs 20, thereby improving the adhesive strength and electrical characteristics of the tabs 20.

The plurality of solar cells 1 thus connected with the tabs 20 are placed between a glass front-side member 41 and a rear-side member 42, which is made of a material like a weatherproof film, glass or plastic, so that the front-side electrode 11 faces the front-side member 41 and the rear-side electrode 12 faces the rear-side member 42, with light-transmitting sealing member 43, such as EVA, placed so as to sandwich the solar cells. Then, the solar cells 1 interposed between the front-side member 41 and rear-side member 42 are encapsulated with the sealing sheet 43 by a laminating machine, thereby obtaining a solar cell module as shown in FIG. 6.

The above-described solar cell module is inserted in a frame, which is made of aluminum or the like, with a sealing material applied to the outer periphery of the solar cell module, if needed. The frame is made of aluminum, stainless, a roll-formed steel plate or the like. If necessary, a terminal box (not shown) is provided, for example, on a surface of the rear-side member 42.

In the solar cell module of the third embodiment, the finger electrodes 120 on the rear surface include wide rear-side auxiliary electrode sections 120b in regions where the front-side finger electrodes 110 face and the tabs 20 are to be disposed. As a result, the third embodiment provides the same effect as the previous embodiments.

Figure 25:
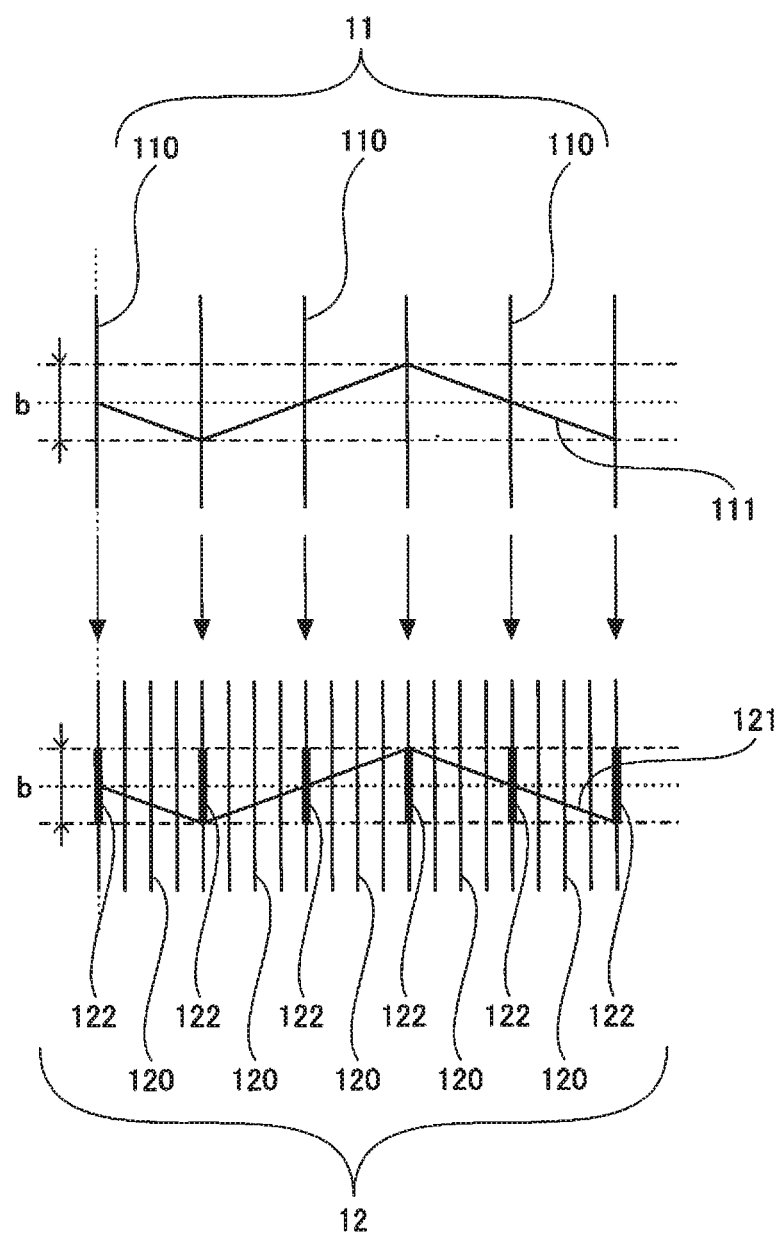
FIG. 25 is a schematic plan view of a solar cell, which is a modification according to the third embodiment of the invention.

A modification of the third embodiment is shown in FIG. 25 and will be described. In the aforementioned third embodiment, the rear-side finger electrodes 120 in the regions opposite to the front-side finger electrodes 110 are formed wide throughout their length. In comparison with the wide rear-side finger electrodes, this modification of the third embodiment shown in FIG. 25 employs rear-side finger electrodes 120 including wide auxiliary electrode sections 122 in regions where the front-side finger electrodes 110 face and the tabs 20 are to be disposed. The auxiliary electrode sections 122 have a length sufficient to cover the region slightly wider than the tabs 20 in consideration of mechanical errors to be made during tab bonding, more specifically, the auxiliary electrode sections 122 have roughly the same length as the width (b) defined by the above-described zigzag bus-bar electrode 121.

Since the auxiliary electrode sections 122 are provided to only the regions where the finger electrodes 110, 120 on the front and rear surfaces of the solar cell 1 face each other and the tabs 20 are to be disposed, the positions opposite to the front-side finger electrodes 110 are occupied by the auxiliary electrode sections 122 of the finger electrodes 120 on the rear surface even if a mechanical error occurs. Consequently, pressure applied during thermocompression bonding can be received by the finger electrodes 110 and auxiliary electrode sections 122 on the front and rear surfaces, thereby canceling out the pressure on the front and rear surface and relieving the shear stresses. Since the electrodes do not need to be wide throughout their length in this embodiment, the amount of silver paste used to form the electrodes can be reduced. In addition, reduction of the stress applied on the solar cell by the finger electrodes can reduce the amount of curling in the solar cell, which leads the yield improvement.

The auxiliary electrode sections 122 are not limited to what is shown in FIG. 25, and the auxiliary electrode sections configured as shown in FIGS. 9 to 14 are also applicable.

Figure 26A:
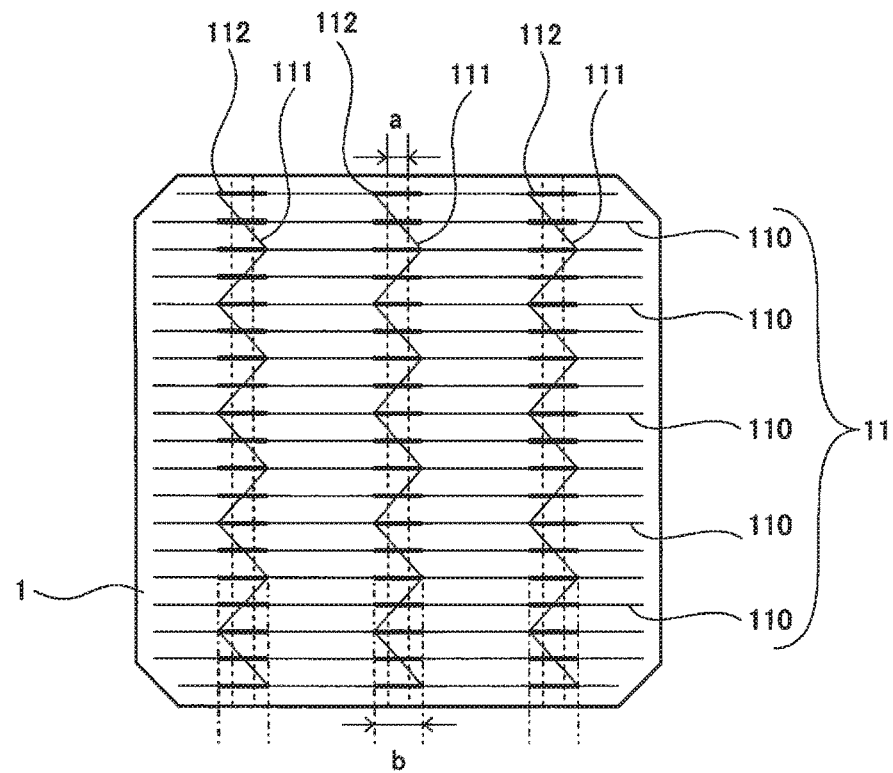
FIG. 26A is a plan view of a solar cell according to the fourth embodiment of the invention, viewed from a light-receiving surface (front surface) side.
Figure 26B:
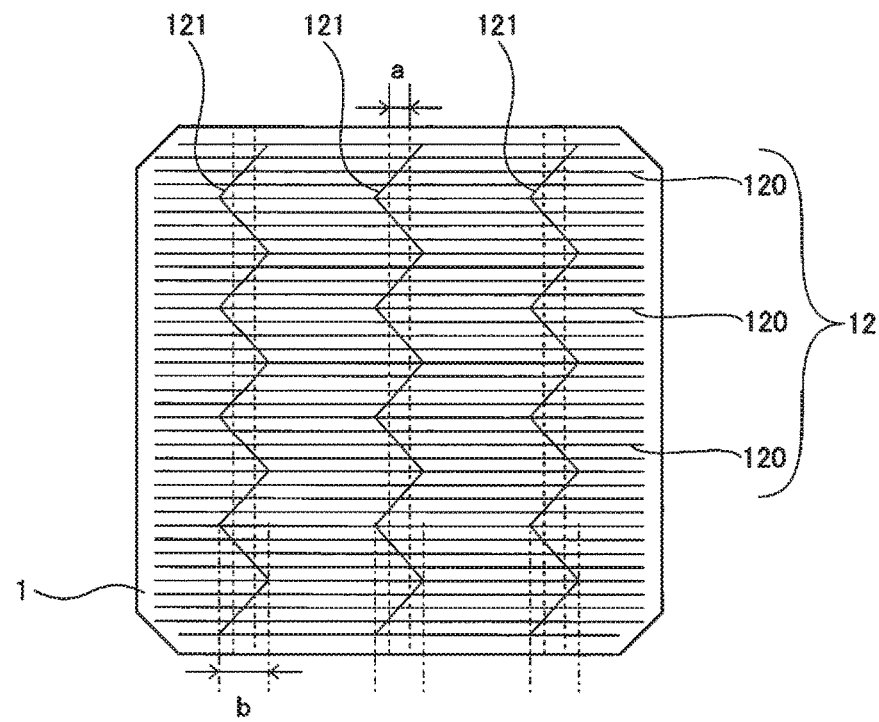
FIG. 26B is a plan view of a solar cell according to the fourth embodiment of the invention, viewed from the rear surface side.
Figure 27:
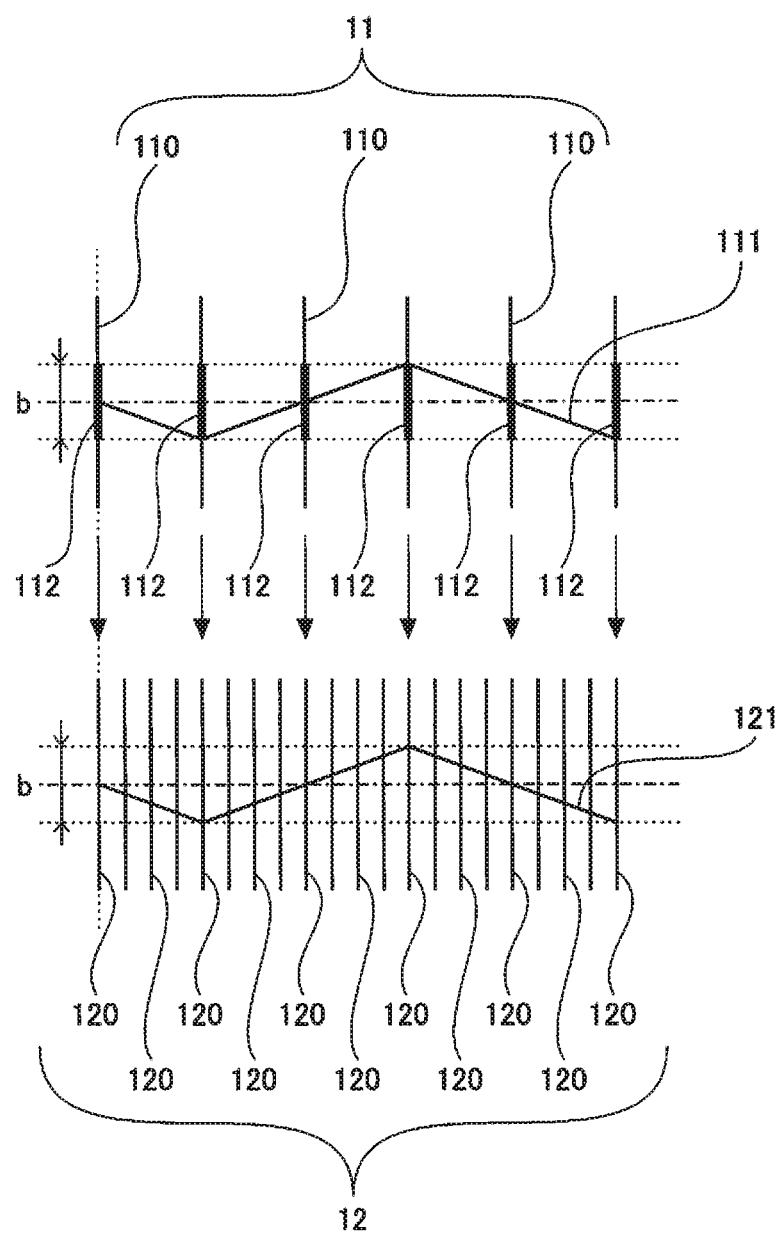
FIG. 27 is a schematic plan view showing a relevant part of the solar cell according to the fourth embodiment of the invention.

The fourth embodiment of the present invention will be described. FIGS. 26A and 26B are plan views of a solar cell according to the fourth embodiment: FIG. 26A is viewed from a light-receiving surface side; and FIG. 26B is viewed from a rear surface side. FIG. 27 is a schematic plan view showing a relevant part of the solar cell. This embodiment employs bus-bar electrodes 111, 121 to improve current collecting efficiency and adhesive strength as in the case of the second embodiment, and auxiliary electrode sections 112 provided at positions where tabs 20 are to be disposed on the front-side finger electrodes 110.

A front-side electrode 11 is provided with bus-bar electrodes 111 that are aligned with positions where tabs are to be connected. As described above, when the width a of the tabs 20 is 1.2 mm, a zigzag bus-bar electrode 111 having a width greater than the finger electrodes 110 and roughly the same thickness as the finger electrodes 110 is provided within a space of 1.6 mm (b in FIGS. 26A, 26B) to allow for a total error of ±0.2 mm of: an error that may occur during positioning of the tab and is determined by machine accuracy; and a position accuracy error in the bus-bar electrodes. The bus-bar electrodes 111 are arranged within the ranges (b in FIGS. 26A, 26B) indicated by dot-and-dash lines in FIGS. 26A and 26B and defined in consideration of the mechanical error in the tabs 20. Specifically, the bus-bar electrodes 111 extend leftward in a slanting direction from the center position in the drawings, are bent rightward in a slanting direction upon reaching a point 0.8 mm left from the center position, and extend 1.6 mm from a left end to a right end. Then, the bus-bar electrodes 111 are bent leftward upon reaching the right end, resulting in the zigzag shape extending in the direction in which the tabs are to be bonded. This embodiment employs three bus-bar electrodes 111. The front-side finger electrodes 110 have the auxiliary electrode sections 112 in regions where the tabs 20 are to be disposed. In addition, a zigzag pattern is formed at intervals of five finger electrodes 110.

In addition, the rear-side electrode 12 is also provided with bus-bar electrodes 121 that are aligned with positions where tabs are to be connected. As described above, when the width a of the tab 20 is 1.2 mm, a zigzag bus-bar electrode 121 having a width greater than the electrode finger 120 and the same thickness as the finger electrodes 120 is provided within a space of 1.6 mm (b in FIGS. 26A, 26B) to allow for a total error of ±0.2 mm of: an error that may occur during positioning of the tab and is determined by machine accuracy; and a position accuracy error in the bus-bar electrodes. The bus-bar electrodes 121 are arranged within the ranges (b in FIGS. 26A, 26B) indicated by dot-and-dash lines in FIGS. 26A and 26B and defined in consideration of the mechanical error in the tabs 20. Specifically, the bus-bar electrodes 121 extend leftward in a slanting direction from the center position in the drawings, are bent rightward in a slanting direction upon reaching a point 0.8 mm left from the center position, and extend 1.6 mm from a left end to a right end. Then, the bus-bar electrodes 121 are bent leftward upon reaching the right end, resulting in the zigzag shape extending in the direction in which the tabs are to be bonded. This embodiment employs three bus-bar electrodes 121. The bus-bar electrodes 111 of the front-side electrode 11 and the bus-bar electrodes 121 of the rear-side electrode 12 are formed at positions where they overlap each other. In other words, the bus-bar electrodes 111, 121 are arranged so that the rear-side bus-bar electrodes 121 on the rear surface of the solar cell 1 face the front-side bus-bar electrodes 111.

As shown in FIGS. 26A, 26B and 27, the number of the finger electrodes 120 of the rear side electrode 12 is set to be greater than the number of the finger electrodes 110 of the front-side electrode 11.

As show in FIGS. 26A, 26B and 27, since the finger electrodes 110 on the front surface include the auxiliary electrode sections 112 only in the regions where the finger electrodes 120 on the rear surface face and the tabs 20 are to be disposed, even if a mechanical error occurs, the auxiliary electrode sections 112 of the front-side finger electrodes 110 are positioned opposite to the finger electrodes 120 on the rear surface. Consequently, this embodiment also provides the same effect as the previous embodiments.

In this embodiment, the zigzag bus-bar electrodes 111, 121 are arranged in the regions where the tabs 20 are to be connected. These bus-bar electrodes 111, 121 make excellent electrical connections with the tabs 20. In other regions where the finger electrodes 110, 120 are absent, the bus-bar electrodes 111, 121 are connected to the tabs 20, thereby improving adhesive strength and the electrical characteristics of the tabs 20.

The auxiliary electrode sections 112 are not limited to what is shown in FIG. 27, and the auxiliary electrode sections configured as shown in FIGS. 17 to 22 are also applicable.

Figure 28:
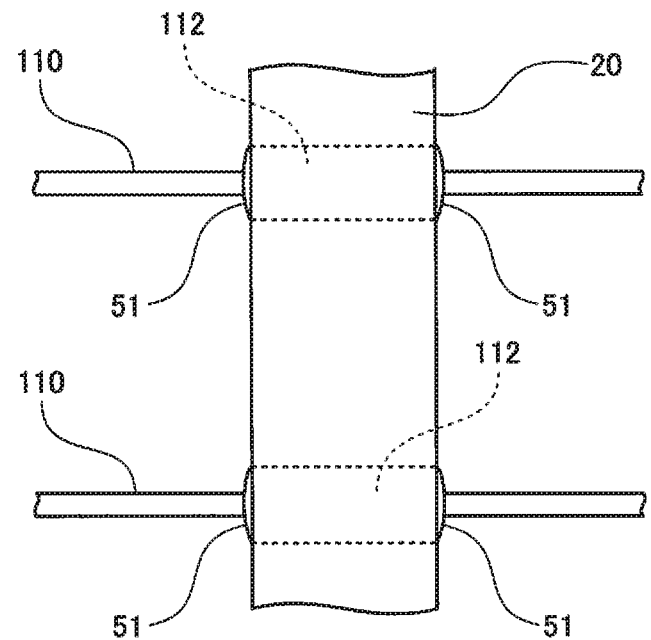
FIG. 28 is a schematic plan view showing a tab connected with auxiliary electrode sections and finger electrodes according to the fourth embodiment of the invention.
Figure 29:
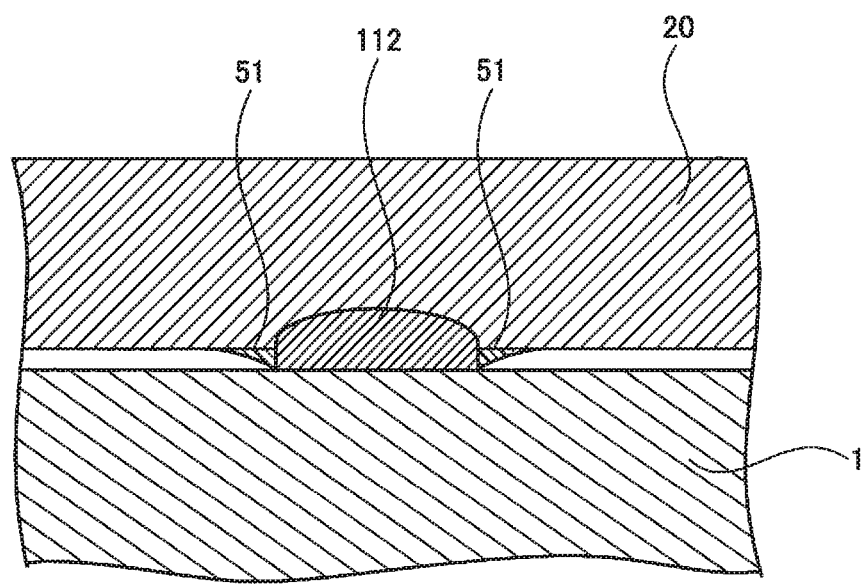
FIG. 29 is a schematic cross-sectional view showing a tab connected with an auxiliary electrode section and electrode finger according to the fourth embodiment of the invention.
Figure 30A:
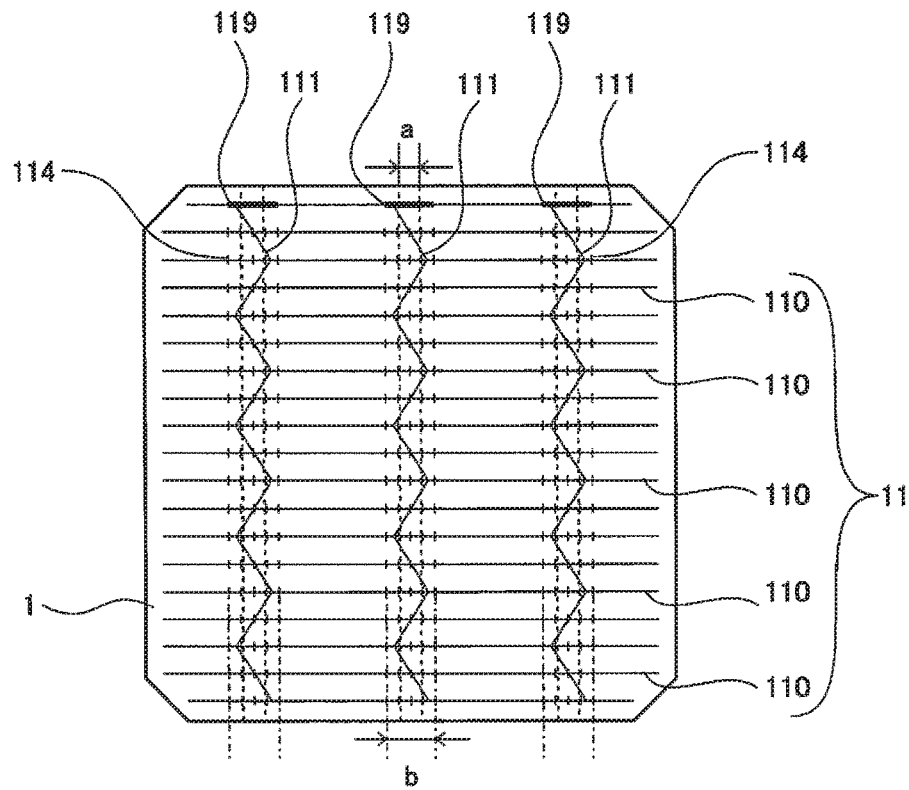
FIG. 30A is a plan view of a solar cell, which is a modification according to the fourth embodiment of the invention, viewed from a light-receiving surface (front surface) side.
Figure 30B:
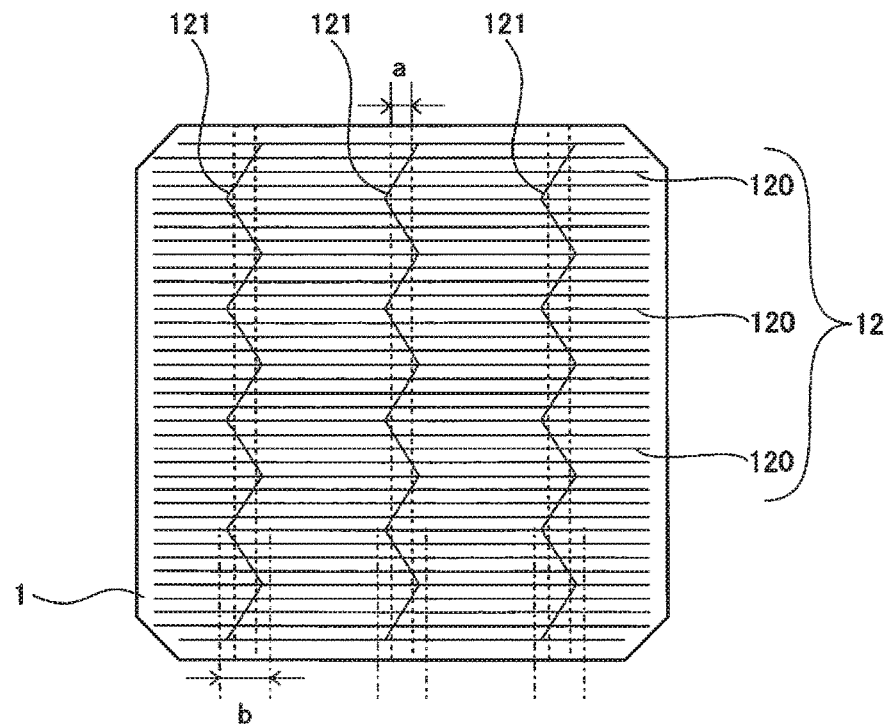
FIG. 30B is a plan view of a solar cell, which is a modification according to the fourth embodiment of the invention, viewed from a rear surface side.

By the way, reduction in the thickness of the resin adhesive 5, which may be an anisotropic conductive resin film, results in reduction of the adhesive part to connect the tabs 20 and the auxiliary electrode sections 112 and finger electrodes 120. For example, as shown in schematic views of FIGS. 28 and 29, when heated tabs 20 are pressed to connect the auxiliary electrode sections 112 of the front-side finger electrodes 110 and the tabs 20, resin adhesive in the shape of a fillet is formed at ends of the parts where the tabs 20 are connected to the auxiliary electrode sections 112 so as to run from the surfaces of the tabs 20 to the sides of the auxiliary electrode sections 112. The fillet adhesive layers 51 connect the auxiliary electrode sections 112 and tabs 20. As a result, the connection strength between the front-side finger electrodes 110 and tabs 20 are maintained mainly by the fillet adhesive layers 51, and therefore the adhesive strength can be preserved even if the thickness of the resin adhesive 5 is reduced.

In a similar way, the rear-side finger electrodes 120 are connected to the tabs 20 with the fillet adhesive layers. The rear-side finger electrodes 120 whose number is greater than that of the front-side finger electrodes provide greater adhesive strength in comparison with the front side.

In view of the circumstances, a modification of the fourth embodiment made for the purpose of increasing adhesive strength of the front-side auxiliary electrode sections will be shown in FIGS. 30A, 30B to 32. This modification is configured to have auxiliary electrode sections 114 each including a plurality of electrode lines 114a aligned in parallel with the tabs 20; however, on the opposite ends of the solar cell 1, auxiliary electrode sections 119 each having a large width and large area are provided.

Figure 32:
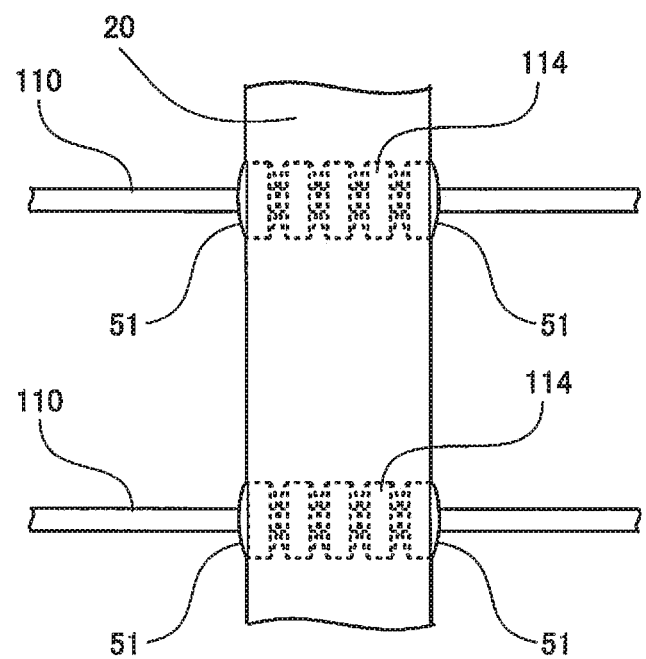
FIG. 32 is a schematic cross-sectional view showing a tab connected with auxiliary electrode sections and finger electrodes according to the modification of the fourth embodiment of the invention.

In the aforementioned case where the auxiliary electrode sections including the plurality of electrode lines 114a, a fillet adhesive layer 51 is formed on opposite sides of each electrode line 114a as shown in FIG. 32, and the fillet adhesive layers 51 formed on the electrode lines 114a connect the finger electrodes 110 and tab 20. Consequently, the quantity of the fillet adhesive layers 51 connecting to the tab 20 is increased, which improves the adhesive strength between the tab 20 and the front-side electrode 11.

In addition, the finger electrodes 110 other than those at the opposite ends of the solar cell 1 can distribute stresses produced during connection of the tabs 20 to the neighboring finger electrodes 110. On the other hand, the finger electrodes 110 at the opposite ends of the solar cell receive concentrated stresses produced during connection of the cabs 20 because there are no finger electrodes on the outer side of the finger electrodes 110 on the ends of the solar cell. To solve the problem, this modification provides large-area auxiliary electrode sections 119 on the opposite ends under the tabs to distribute stresses derived from connecting operations.

The bus-bar electrodes 111, 121 in this embodiment are formed in a zigzag shape. More specifically, in the regions where the tabs 20 are to be disposed, the bus-bar electrodes 111, 121 are formed to extend from the center position in a slanting direction to respective ends defined in consideration of mechanical errors and bend at the ends. Consequently, the zigzag shape causes the bus-bar electrodes 111 to be positioned differently on the finger electrodes 110: some parts of the bus-bar electrode 111 intersect electrode finger 110 at the opposite ends of the region (b in FIG. 30) defined in consideration of mechanical errors to dispose the tab 20; and some parts of the bus-bar electrode 111 intersect the center of the electrode finger 110.

The relationship between the thus formed finger electrodes 110 and bus-bar electrodes 111 causes differences in stress according to the position of the bus-bar electrodes 111 with a thrust applied to the tabs 20 mounted on the finger electrodes and bus-bar electrodes.

Figure 33:
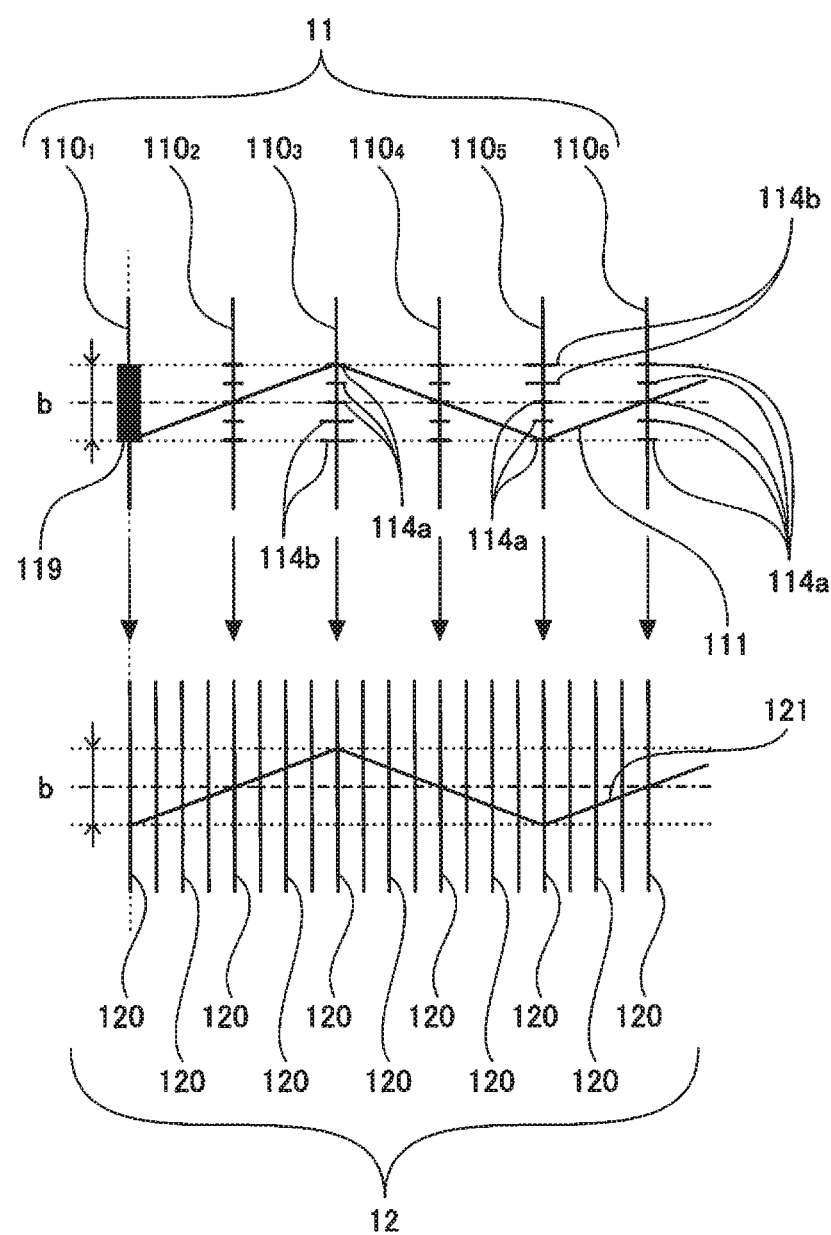
FIG. 33 is a schematic plan view showing a relevant part of a solar cell, which is a modification according to the fourth embodiment of the invention.

For example, the embodiment shown in FIG. 33 includes an electrode finger $110_1$ placed at an end of the solar cell 1 and finger electrodes $110_2$ to $110_6$ placed toward the inside in this order from the next to the electrode finger $110_1$. In this modification, a bus-bar electrode 111 extends in a slanting direction toward the upper right from a bottom point, which is on the electrode finger $110_1$, defined in consideration of mechanical errors in tabs and indicated by a dot-line in FIG. 33, intersects the center of the electrode finger $110_2$ next to the electrode finger $110_1$, reaches and bends at a top point, which is on the electrode finger $110_3$ next to the electrode finger $110_2$ and indicated by a dot-line in FIG. 33, and extends in a slanting direction toward the lower right. The bus-bar electrode 111 then intersects the center of the electrode finger $110_4$ formed next to the electrode finger $110_3$, reaches and bends at a bottom point, which is on the next electrode finger $110_5$ and indicated by a dot-line in FIG. 33, and extends in a slanting direction toward the upper right.

In the thus formed front-side electrode 11, thermocompression bonding of the tab 20 induces uneven stresses to the finger electrodes $110_3$, $110_5$ at the positions where the bus-bar electrode 111 is bent and the positions where the bus-bar electrode 111 is absent, these positions are opposite ends of the tab 20. More specifically, the bus-bar electrode 111 is present on the right and left sides of the electrode finger $110_3$ in the region where the bus-bar electrode 111 are present, but the electrode finger $110_3$ is laid alone in the region where the bus-bar electrode 111 is absent, and therefore the area of the electrodes under the tab 20 varies significantly according to the position.

This difference in area causes uneven stress that leads variations in adhesive strength or the like. This embodiment is configured to equalize the area of the finger electrodes 110 under the tab 20 by adjusting the length of the electrode lines 114 making up the auxiliary electrode sections 114 according to the position of the bus-bar electrode 111.

In the modification in FIG. 33, the length of the electrode lines of the auxiliary electrode sections 114 provided to the finger electrodes $110_3$, $110_5$ are adjusted. In this modification, two electrode lines 114a near the bus-bar electrode 111 are formed nearly twice as wide as the electrode finger 110, while two electrode lines 114b on the further side from the bus-bar electrode 111, corresponding to a side end of the tab 20, are formed longer than the electrode lines 114a. For example, the electrode lines 114b may have a width twice as large as the electrode lines 114a.

In addition, the finger electrodes $110_2$, $110_4$ in which the bus-bar electrode 111 intersects the center thereof, include the auxiliary electrode sections 114 including the electrode lines 114a of the same length.

The variations in length of the electrode lines 114a, 114b of the auxiliary electrode sections 114 according to the intersecting position of the bus-bar electrode 111 can equalize the area of the electrodes under the tab 20, thereby spreading out the stresses produced during connection of the tab 20. Consequently, the bus-bar electrode 111, auxiliary electrode section 114 and tab 20 can be securely connected with sufficient adhesive strength.

Even in a case of using a thin resin adhesive 5, the auxiliary electrode section as configured according to the embodiment is preferable because the electrode lines of the finger electrodes 110 and bus-bar electrode 111 are connected with the fillet adhesive layers 51.

If the auxiliary electrode section 114 includes a plurality of electrode lines 114a, a fillet adhesive layer 51 is formed on opposite sides of each electrode line 114a as shown in FIG. 32. Every fillet adhesive layer 51 formed on the electrode lines 114a connects the finger electrodes 110 and tabs 20. Consequently, the quantity of the fillet adhesive layers 51 in contact with the tab 20 increases, and therefore the adhesive strength between the tab 20 and front electrode 11 is enhanced.

In addition, the finder electrodes 110 other than those at the opposite ends of the solar cell 1 can distribute stresses produced during connection of the tabs 20 to the neighboring finger electrodes 110. On the other hand, the finger electrodes 110 at the opposite ends of the solar cell receive concentrated stresses produced during connection of the tabs 20 because there are no finger electrodes on the outer side of the finger electrodes 110 on the ends of the solar cell. To solve the problem, this modification provides the large-area auxiliary electrode sections 119 on the opposite ends under the tabs to distribute stresses derived from connecting operations.

The rear-side finger electrodes 120 are designed to be connected to the tabs 20 with the fillet adhesive layers in the same manner. Since the number of the rear side finger electrodes 120 is greater than that of the front-side finger electrodes, the adhesive strength is increased to be more than that of the front-side finger electrodes.

It is possible to make all of the electrode lines 114a long; however, such long electrode lines require more silver to form them. Because of that, it is preferable to make only necessary electrode lines long.

Figure 34:
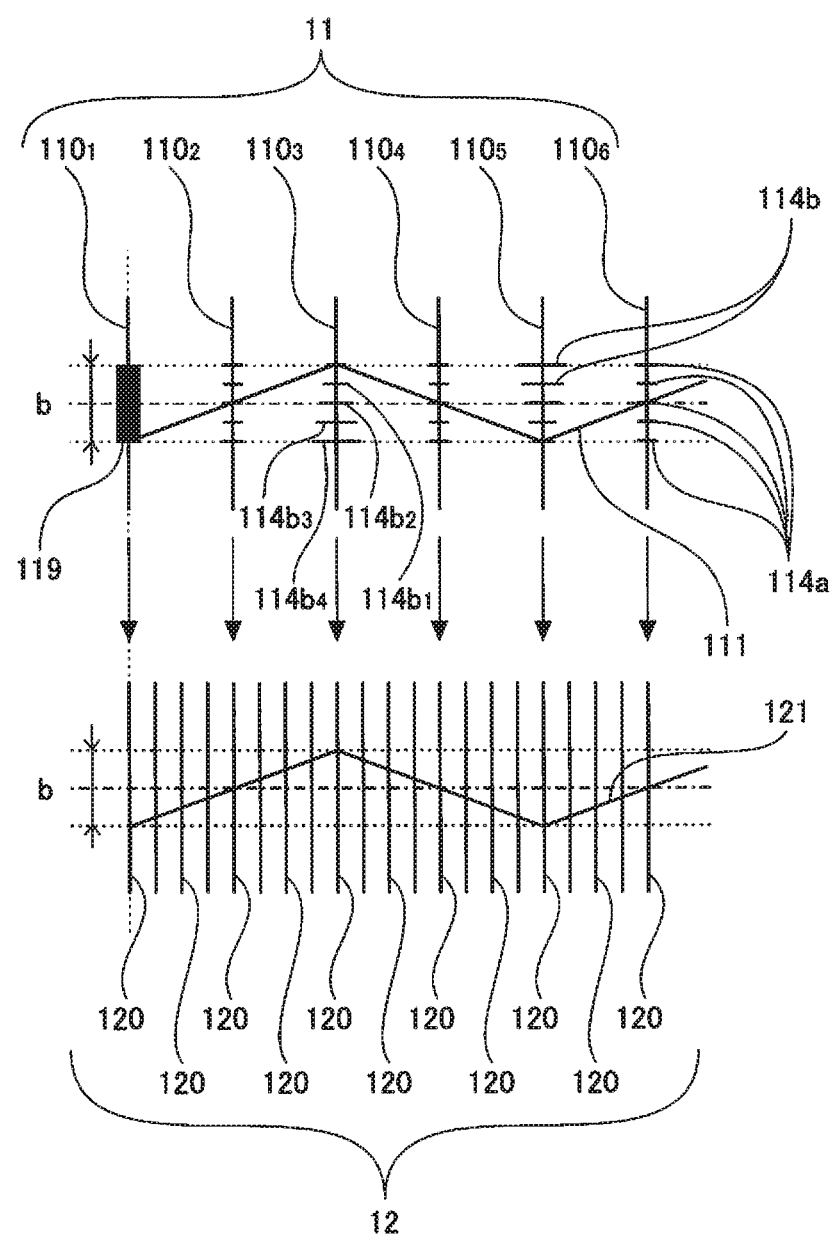
FIG. 34 is a schematic plan view showing a relevant part of a solar cell, which is a modification according to the fourth embodiment of the invention.

In FIG. 33, the length of the electrode lines of the auxiliary electrode sections 114 provided to the finger electrodes $110_3$, $110_5$ are adjusted. In this modification, two electrode lines 114a near the bus-bar electrode 111 are formed wide, nearly twice as wide as the electrode finger 110, while two electrode lines 114b on the further side from the bus-bar electrode 111, corresponding to a side end of the tab 20, are formed longer than the electrode lines 114a. The length of the electrode lines of the auxiliary electrode sections 114 is not limited thereto, but, as shown in FIG. 34, can be set to increase in length as the distance of the electrode lines from the zigzag bus-bar electrode 111 increases. In other words, the auxiliary electrode sections 114 provided to the finger electrodes $110_3$, $110_5$ includes electrode lines $114b_1$, $114b_2$, $114b_3$, $114b_4$ that are gradually incremented in length in this order from an electrode line 114a in contact with the bus-bar electrode 111.

Figure 31:
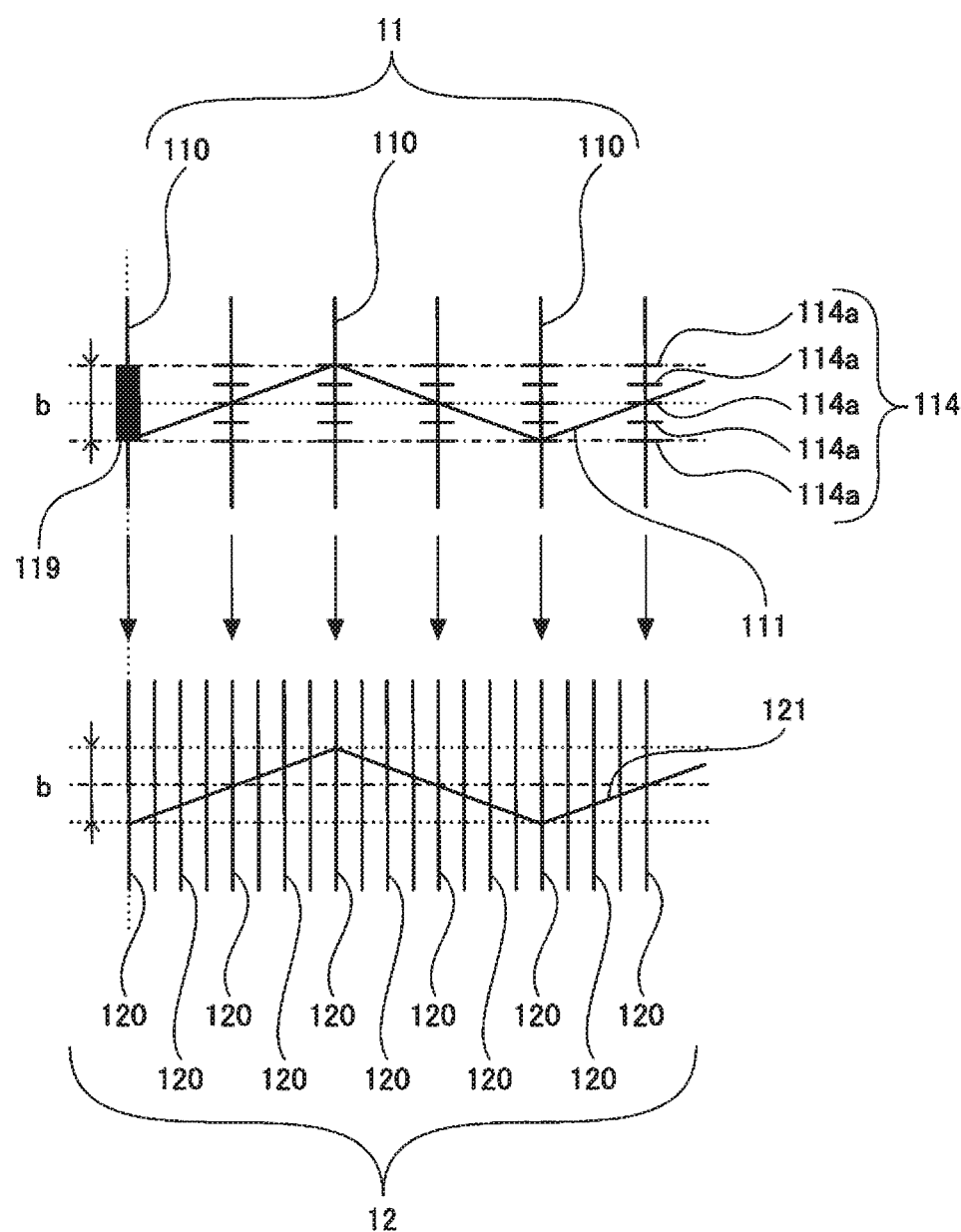
FIG. 31 is a schematic plan view showing a relevant part of the solar cell according to the modification of the fourth embodiment of the invention.
Figure 35:
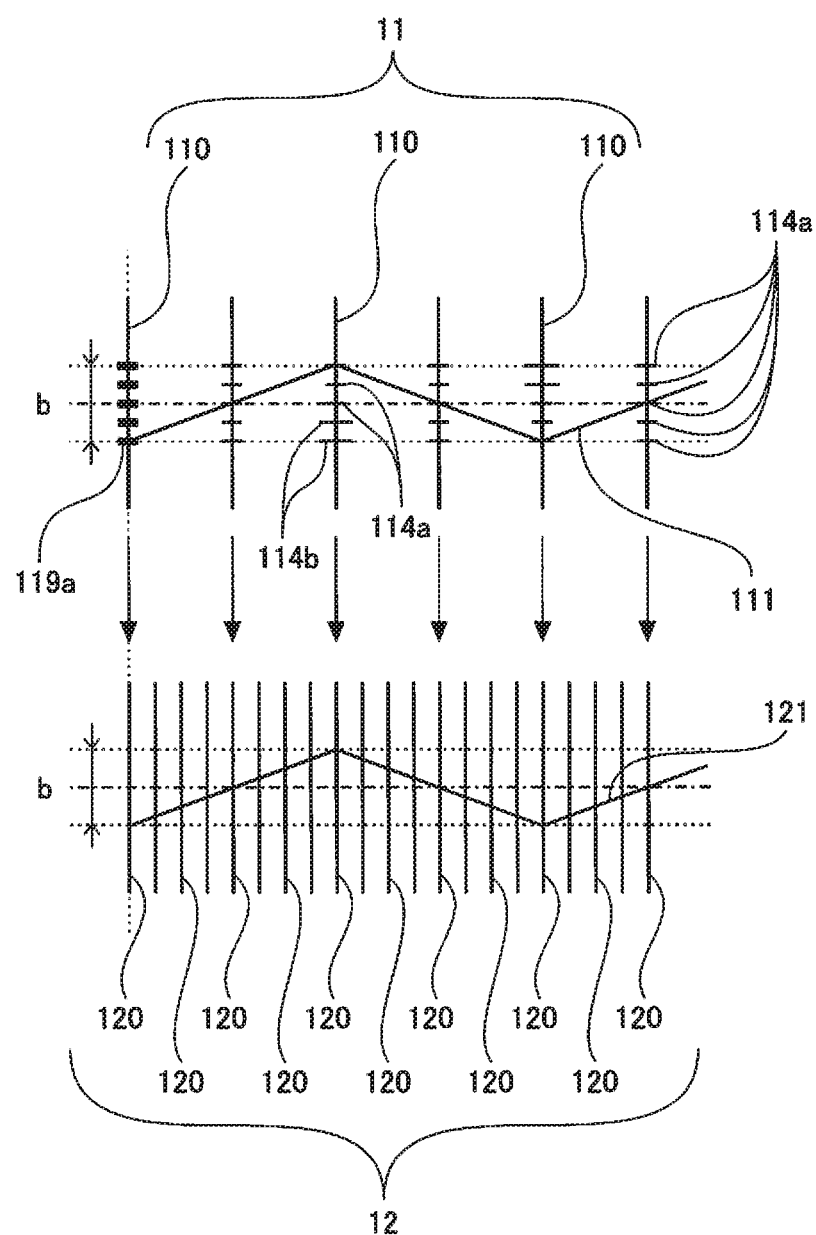
FIG. 35 is a schematic plan view showing a relevant part of a solar cell, which is a modification according to the fourth embodiment of the invention.
Figure 36:
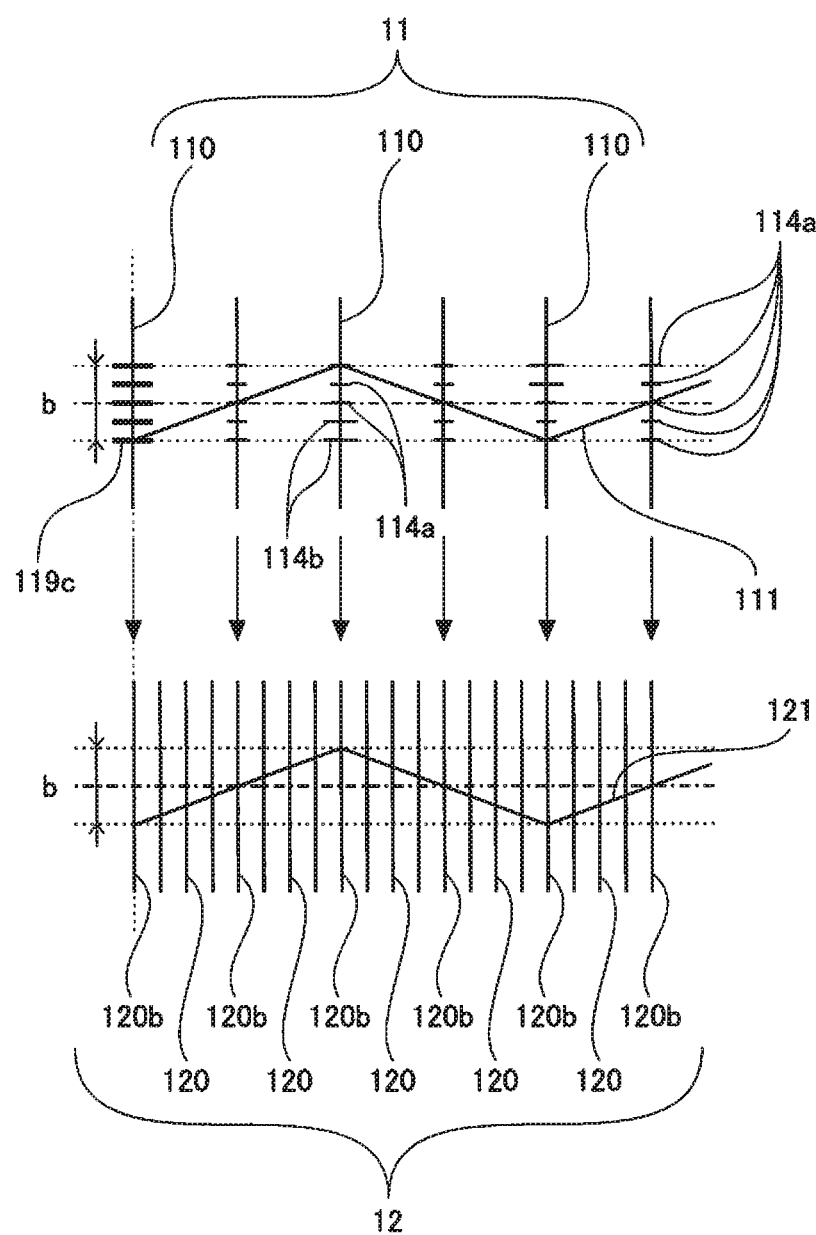
FIG. 36 is a schematic plan view showing a relevant part of a solar cell, which is a modification according to the fourth embodiment of the invention.

As described above, the auxiliary electrode sections 119 on the opposite ends of the solar cell and under the tabs are configured to be large in area to spread out the stresses produced during connection of the tabs. The shape of the auxiliary electrode sections are not limited to the single island shape as shown in FIGS. 31, 33 and 34, and can be anything as long as the total area is large. The auxiliary electrode sections shown in FIG. 35 or 36 include a plurality of electrode lines 119a in parallel with a tab 20 and the total area of the electrode lines 119a is set to a predetermined value, and therefore can provide a desired effect. A modification in FIG. 35 employs an auxiliary electrode section including wide electrode lines. A modification in FIG. 36 employs an auxiliary electrode section including long electrode lines 119c to have the predetermined area. The use of the plurality of electrode lines whose opposite ends are provided with fillet adhesive layers increases the adhesive strength.

Figure 37:
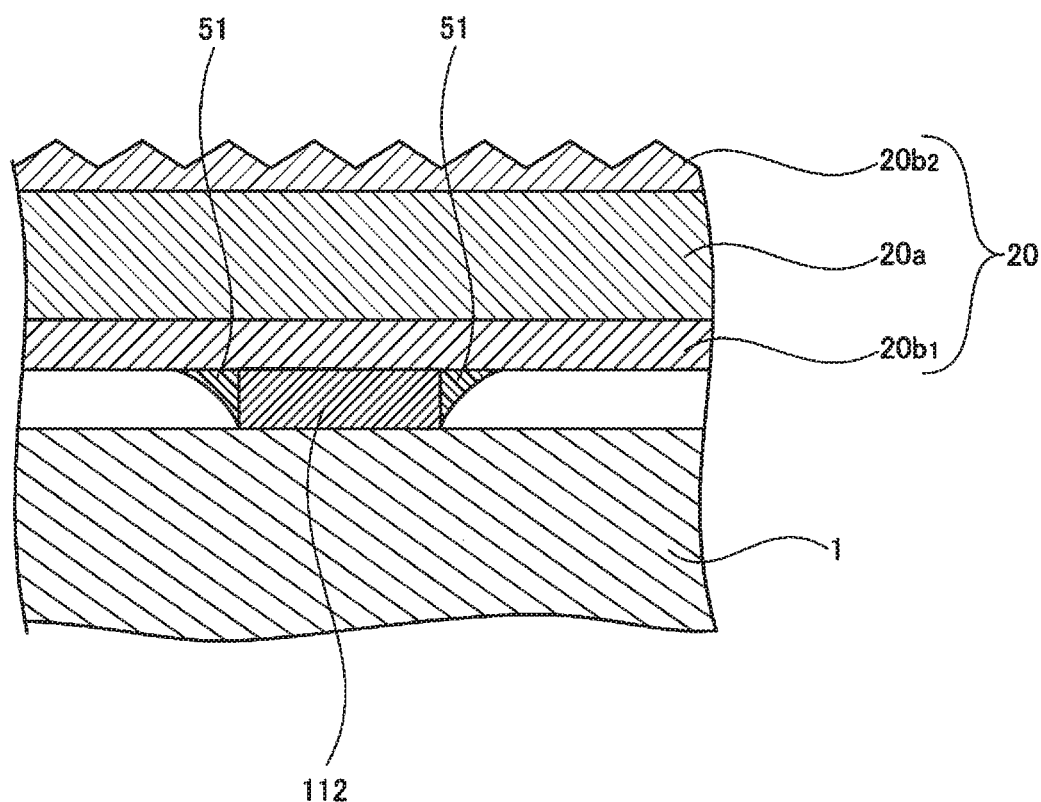
FIG. 37 is a schematic cross-sectional view showing a tab connected with an auxiliary electrode section and electrode finger according to the modification of the embodiment of the invention.
Figure 38:
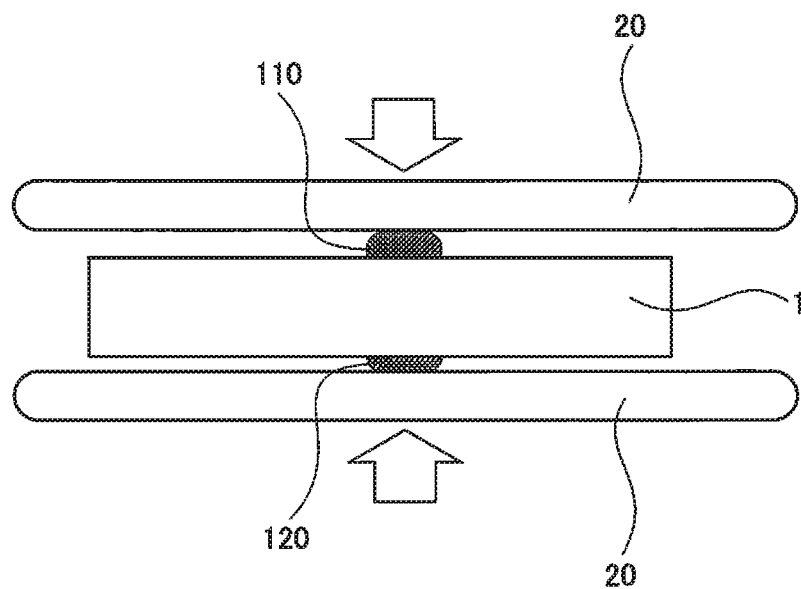
FIG. 38 is a schematic view showing a tab connecting process of a conventional solar cell module.
Figure 39:
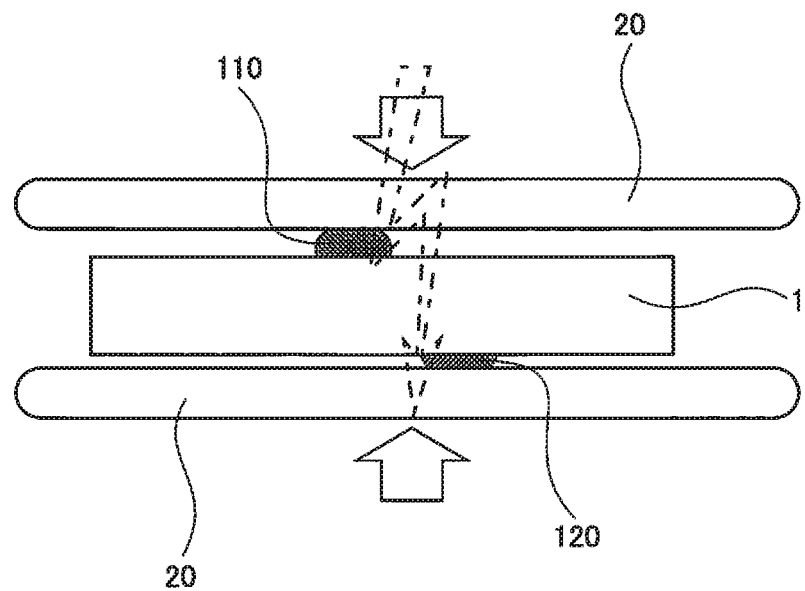
FIG. 39 is a schematic view showing a tab connecting process of a conventional solar cell module.

In the above-described embodiments, the tabs 20 are made of a conductive material, such as a copper foil, coated with a conductive film, such as tin (Sn) and solder, which softer than the surface-side electrodes 11, 12, and are connected with the front-side electrode 11 and rear-side electrode 12 so that parts of the electrodes dig in the conductive film; however, the tab 20 is not limited thereto. For example, as shown in FIG. 37, the tab can be made by coating the surface of a conductive material 20a, such as a copper foil, with silver $20b_1$ and $20b_2$. The front surface $20b_2$ of the tab 20 is configured to have fine asperities that scatter light. Since the silver-coated tab 20 is as rigid as or more rigid than the surface-side electrodes 11, 12, the surface-side electrodes 11, 12 do not dig in the tab 20, but surfaces of the surface-side electrodes 11, 12 are deformed to make full contact with the tab. In such a configuration, the auxiliary electrode section 112 of the electrode finger 110 and the coating surface $20b_1$ of the tab 20 are connected to each other with the fillet adhesive layers 51, thereby obtaining predetermined connection strength.

In the case where the fillet adhesive layers 51 are used to connect the finger electrodes 110, 120 and tabs 20, gaps or the like between the fillet adhesive layers 51 play a roll like a buffer layer. Even if the adhesive layers used in a solar cell module repeatedly undergo thermal expansion and thermal shrinkage, it can be expected to prevent the tabs 20 from peeling.

In the above-described embodiments, an adhesive resin tape is used as the adhesive layer 51 for connecting the tab 20 and electrodes 11, 12; however, the adhesive layer 51 for connecting the tab 20 and electrodes 11, 12 can be resin paste, such as an anisotropic conductive resin paste.

It should be understood that the embodiments disclosed herein are to be taken as examples in every point and are not limited. The scope of the present invention is defined not by the above described embodiments but by the appended claims. All changes that fall within means and bounds of the claims, or equivalence of such means and bounds are intended to be embraced by the claims.

The invention claimed is:

1. A solar cell module comprising:
a solar cell including a first main surface and a second main surface opposite to the first main surface;
a first wiring member connected to the first main surface of the solar cell; and
a second wiring member connected to the second main surface of the solar cell, wherein
the solar cell comprises:
a first electrode provided on the first main surface side of the solar cell and connected to the first wiring member, wherein the first electrode includes a plurality of first finger electrodes parallel to each other; and
a plurality of second finger electrodes provided on the second main surface side of the solar cell and connected to the second wiring member, wherein the plurality of second finger electrodes are parallel to each other and face regions where the plurality of first finger electrodes are present, and the plurality of second finger electrodes are separated from each other in an area overlapping with the second wiring member,
each of the plurality of second finger electrodes continuously extends in a first direction across the area overlapping with the second wiring member and includes a non-auxiliary electrode section and an auxiliary electrode section, wherein the non-auxiliary electrode section is provided outside of the area overlapping with the second wiring member, the auxiliary electrode section is provided in the area overlapping with the second wiring member, a width, in a second direction orthogonal to the first direction, of the auxiliary electrode section is greater than a width, in the second direction, of the non-auxiliary electrode section, and the auxiliary electrode section comprises a same material as that of the non-auxiliary electrode section,
the plurality of second finger electrodes include two outermost second finger electrodes provided at outermost positions among the plurality of second finger electrodes in the second direction and other second finger electrodes other than the two outermost second finger electrodes, and
an area of the auxiliary electrode section of one of the two outermost second finger electrodes is larger than an area of the auxiliary electrode section of one of the other second finger electrodes.

2. The solar cell module according to claim 1, wherein
the first main surface comprises a light receiving surface of the solar cell, and
the second main surface comprises a rear surface of the solar cell.

3. The solar cell module according to claim 2, wherein
the solar cell further comprises a plurality of third finger electrodes provided on the rear surface side of the solar cell and parallel to each other, wherein the second wiring member is connected to the plurality of third finger electrodes, and the plurality of third finger electrodes face regions where the plurality of first finger electrodes are absent, and
in the area overlapping with the second wiring member, a width of each of the plurality of third finger electrodes is less than the width of the auxiliary electrode section.

4. The solar cell module according to claim 2, wherein
a thickness of each of the plurality of first finger electrodes is greater than a thickness of each of the plurality of second finger electrodes.

5. The solar cell module according to claim 1, wherein
the plurality of second finger electrodes are connected to the second wiring member with an adhesive resin film having a light transmitting property.

6. The solar cell module according to claim 1, wherein
the second wiring member comprises: a copper foil; and a conductive film comprising at least one of tin and solder and provided on the copper foil, such that a part of each of the plurality of second finger electrodes is embedded in the conductive film of the second wiring member.

7. The solar cell module according to claim 1, wherein
a length, in the first direction, of each auxiliary electrode section is greater than a width of the second wiring member.

8. The solar cell module according to claim 1, wherein
each auxiliary electrode section linearly extends in the first direction.

9. The solar cell module according to claim 1, wherein
each auxiliary electrode section linearly extends in the first direction across the area overlapping with the second wiring member.

10. The solar cell module according to claim 1, wherein
the width, in the second direction, of each auxiliary electrode section is constant across the area overlapping with the second wiring member.

11. A solar cell module comprising:
a solar cell including a first main surface and a second main surface opposite to the first main surface;
a first wiring member connected to the first main surface of the solar cell; and
a second wiring member connected to the second main surface of the solar cell, wherein
the solar cell comprises:
a first electrode provided on the first main surface side of the solar cell and connected to the first wiring member, wherein the first electrode includes a plurality of first finger electrodes parallel to each other; and
a plurality of second finger electrodes provided on the second main surface side of the solar cell and connected to the second wiring member, wherein the plurality of second finger electrodes are parallel to each other and face regions where the plurality of first finger electrodes are present, and the plurality of second finger electrodes are separated from each other in an area overlapping with the second wiring member, and
each of the plurality of second finger electrodes includes a linear section and a linear auxiliary electrode section, wherein the linear section continuously and linearly extends across the area overlapping with the second wiring member in a first direction, the linear auxiliary electrode section is provided in the area overlapping with the second wiring member and intersects with the linear section, and the linear auxiliary electrode section comprises a same material as that of the linear section, and
the second wiring member comprises: a copper foil; and a conductive film comprising at least one of tin and solder and provided on the copper foil, such that a part of each of the plurality of second finger electrodes is embedded in the conductive film of the second wiring member.

12. The solar cell module according to claim 11, wherein
the plurality of second finger electrodes are connected to the second wiring member with an adhesive resin film having a light transmitting property.

* * * * *